United States Patent
Choi et al.

(10) Patent No.: US 9,766,973 B2
(45) Date of Patent: Sep. 19, 2017

(54) OPERATING METHOD OF MEMORY CONTROLLER AND NONVOLATILE MEMORY DEVICE

(71) Applicant: SAMSUNG ELECTRONICS CO., LTD., Suwon-si, Gyeonggi-Do (KR)

(72) Inventors: Seonghyeog Choi, Gyeonggi-do (KR); Changkyu Seol, Gyeonggi-do (KR); Junjin Kong, Gyeonggi-do (KR); Youngsuk Ra, Seoul (KR); Hong Rak Son, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 60 days.

(21) Appl. No.: 14/713,568

(22) Filed: May 15, 2015

(65) Prior Publication Data
US 2016/0034349 A1    Feb. 4, 2016

(30) Foreign Application Priority Data

Jul. 31, 2014    (KR) .................. 10-2014-0098247

(51) Int. Cl.
| | | |
|---|---|---|
| G11C 5/14 | (2006.01) | |
| G11C 11/56 | (2006.01) | |
| G11C 16/26 | (2006.01) | |
| G06F 11/10 | (2006.01) | |
| G11C 29/02 | (2006.01) | |
| G11C 29/26 | (2006.01) | |
| G11C 29/04 | (2006.01) | |

(52) U.S. Cl.
CPC ...... *G06F 11/1048* (2013.01); *G11C 11/5642* (2013.01); *G11C 29/021* (2013.01); *G11C 29/028* (2013.01); *G11C 29/26* (2013.01); *G11C 2029/0411* (2013.01)

(58) Field of Classification Search
CPC ..... G11C 11/5642; G11C 16/26; G11C 29/00; G11C 16/30; G11C 2211/5641; G11C 16/10; G11C 29/52; G11C 16/3422; G11C 29/42; G11C 29/56008; G11C 29/50004; G11C 2211/5621; G11C 29/50; G11C 7/1006; G11C 13/004; G11C 2013/0054
See application file for complete search history.

(56) References Cited

U.S. PATENT DOCUMENTS

| | | |
|---|---|---|
| 7,420,846 B2 | 9/2008 | Chen et al. |
| 7,634,494 B2 | 12/2009 | Bangalore et al. |
| 7,751,237 B2 | 7/2010 | Alrod et al. |
| 8,095,836 B2 | 1/2012 | Eguchi et al. |
| 8,312,349 B2 | 11/2012 | Reche et al. |

(Continued)

*Primary Examiner* — Phung M Chung
(74) *Attorney, Agent, or Firm* — F. Chau & Associates, LLC

(57) ABSTRACT

A default read operation is performed on a page using a default read voltage set to generate default raw data. If error bits of the default raw data are not corrected, a plurality of low-level read operations is performed on the page using a plurality of read voltage sets to generate a plurality of low-level raw data. Each read voltage set is different from the default voltage set. A read voltage set is selected from the plurality of read voltage sets as a starting voltage set, according to each low-level raw data. A high-level read operation using the selected starting voltage set is performed on the page to generate high-level raw data.

15 Claims, 15 Drawing Sheets

(56) References Cited

U.S. PATENT DOCUMENTS

| | | | |
|---|---|---|---|
| 8,365,030 B1 * | 1/2013 | Choi | G06F 11/1048 714/746 |
| 8,422,291 B2 | 4/2013 | Kim et al. | |
| 8,489,854 B1 | 7/2013 | Colon et al. | |
| 8,503,237 B1 | 8/2013 | Horn | |
| 8,504,884 B2 | 8/2013 | Eguchi et al. | |
| 8,625,347 B2 | 1/2014 | Sakurada | |
| 8,638,602 B1 | 1/2014 | Horn | |
| 8,644,099 B2 | 2/2014 | Cometti et al. | |
| 8,898,543 B2 * | 11/2014 | Jo | G06F 11/1072 714/721 |
| 8,934,301 B2 * | 1/2015 | Yun | G11C 16/06 365/185.03 |
| 9,478,298 B2 * | 10/2016 | Shin | G11C 16/26 |
| 2004/0071023 A1 * | 4/2004 | Tanaka | G11C 11/5628 365/200 |
| 2009/0049364 A1 * | 2/2009 | Jo | G06F 11/1072 714/763 |
| 2010/0302850 A1 * | 12/2010 | Kim | G06F 11/1048 365/185.09 |
| 2012/0084490 A1 | 4/2012 | Choi et al. | |
| 2012/0084627 A1 | 4/2012 | Post et al. | |
| 2013/0073789 A1 | 3/2013 | Khmelnitsky et al. | |
| 2013/0128666 A1 | 5/2013 | Avila et al. | |
| 2013/0326285 A1 | 12/2013 | Eguchi et al. | |
| 2014/0185375 A1 * | 7/2014 | Kim | G11C 11/5642 365/185.02 |

* cited by examiner

OPERATING METHOD OF MEMORY CONTROLLER AND NONVOLATILE MEMORY DEVICE

CROSS-REFERENCE TO RELATED APPLICATION

This application claims priority under 35 U.S.C. §119 Korean Patent Application No. 10-2014-0098247, filed on Jul. 31, 2014 in the Korean Intellectual Property Office, the disclosure of which is incorporated by reference herein in its entirety.

TECHNICAL FIELD

The present inventive concept relates to an operating method of a memory controller and a nonvolatile memory system.

DISCUSSION OF RELATED ART

Nonvolatile memory devices retain their stored data after power is off. The nonvolatile memory devices include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc.

The flash memory is used as a storage medium for mobile systems, such as a smart phone, and a table PC. To increase storage capacity, the flash memory is formed of a multi-level cell which is capable of storing at least two or more bits of data per cell. For example, at least two or more data bits are stored in one memory cell using increased number of program states, so read margin between two adjacent program states is reduced.

The flash memory having such reduced read margin creates error bits in data generated in a read operation. Such error bits may be corrected using error correcting methods.

SUMMARY

According to an exemplary embodiment of the present inventive concept, A method of operating a nonvolatile memory device including a plurality of memory cells is provided. A default read operation is performed on a page using a default read voltage set to generate default raw data. If error bits of the default raw data are not corrected, a plurality of low-level read operations is performed on the page using a plurality of read voltage sets to generate a plurality of low-level raw data. Each read voltage set is different from the default voltage set. A read voltage set is selected from the plurality of read voltage sets as a starting voltage set, according to each low-level raw data. A high-level read operation using the selected starting voltage set is performed on the page to generate high-level raw data.

According to an exemplary embodiment of the present inventive concept, a method of reading data from a nonvolatile memory device including a plurality of memory cells is provided. A default read operation is performed on the plurality of memory cells using a default read voltage set to generate default raw data. Error bits of the default raw data are determined to be corrected. If the error bits of the default raw data are not corrected, first through n-th (n is integer greater than 1) low-level read operations using first through n-th read voltage sets, respectively, are performed to generate first through n-th low-level raw data. Each of the first through n-th low-level read operation includes error correction. If error bits of the first through n-th raw data are not corrected, a read voltage is selected from the default read voltage set and the first through n-th read voltage sets as a starting voltage set on the basis of the first through n-th raw data and the default raw data. A high-level read operation using the starting voltage set is performed. The high-level read operation is performed two or more times depending on the selected starting voltage set.

According to an exemplary embodiment of the present inventive concept, a method of operating a nonvolatile memory device including a plurality of pages is provided. First data is programmed to a page. A default read operation is performed on the first page using a default read voltage set to generate default raw data. If error bits of the default raw data are not corrected, a low-level read operation is repeated on the first page a predetermined number of times or a low-level read operation is repeated until error bits of the low-level read operation are corrected. Each low-level read operation is performed using a first read voltage set different from that of a low-level read operation which is performed previously. The first data is transmitted to an external device if the error bits of the low-level raw data are corrected. A high-level read operation is performed after the low-level read operation is performed the predetermined number of times and if error bits of the low-level read operation performed last are not corrected. The high-level read operation is performed using a starting read voltage, wherein the starting voltage set is selected one from the first read voltage sets and the default read voltage set, according to each low-level raw data generated from each low-level read operation and the default raw data.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
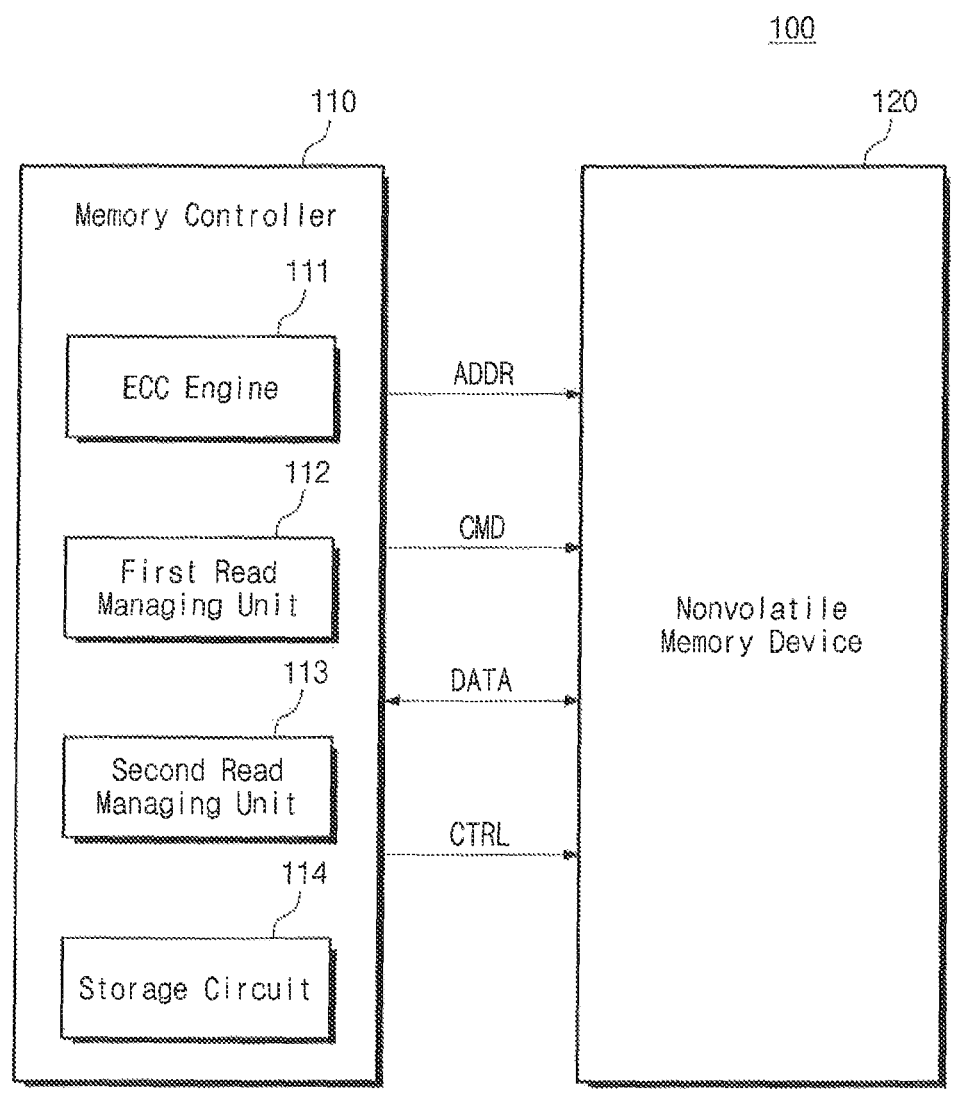
FIG. 1 is a block diagram illustrating a nonvolatile memory system according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a block diagram showing a nonvolatile memory system according to an exemplary embodiment of the present inventive concept. Referring to FIG. 1, a nonvolatile memory system 100 comprises a memory controller 110 and a nonvolatile memory device 120.

In exemplary embodiments, each of the memory controller 110 and the nonvolatile memory device 120 may be provided with the form of a chip, a package, or a module. Alternatively, the memory controller 110 and the nonvolatile memory device 120 may be packaged one of Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP) and etc.

The memory controller 110 may write data to the nonvolatile memory device 120 or read data therefrom. For example, the memory controller 110 sends an address ADDR, a command CMD, a control signal CTRL, and data to the nonvolatile memory device 120 to write the data to the nonvolatile memory device 120. The memory controller 110 also sends an address ADDR, a command CMD, and a control signal CTRL to the nonvolatile memory device 120 to read data therefrom.

The nonvolatile memory device 120 may conduct an operation of writing, reading, or erasing data in response to the signals from the memory controller 110. In exemplary embodiments, the nonvolatile memory device 120 may comprise nonvolatile memory devices, such as a NAND flash memory, a NOR flash memory, a phase-change memory (PRAM), a resistive memory (ReRAM), and a magnetoresistive memory (MRAM). For the convenience of description, it is assumed that the nonvolatile memory device 120 is based on the NAND flash memory. In exemplary embodiments, the nonvolatile memory device 120 may be based on a charge trap flash (CTF) memory.

Memory cells of the nonvolatile memory device 120 have the physical characteristic that a threshold voltage distribution varies due to causes, such as a program elapsed time, a temperature, program disturbance, read disturbance and etc. For example, data stored at the nonvolatile memory device 120 becomes erroneous due to the above causes. The memory controller 110 utilizes a variety of error correction techniques to correct such errors. For example, the memory controller 110 comprises an error correction code (ECC) engine 111, a first read managing unit 112, a second read managing unit 113, and a storage circuit 114.

During a read operation, the memory controller 110 may read data stored at the nonvolatile memory device 120, using a default read voltage set. The default read voltage set may include predetermined read voltages. The ECC engine 111 may detect and correct errors included in data read from the nonvolatile memory device 120. In exemplary embodiments, the ECC engine 111 may be implemented in the form of hardware.

Data read in a read operation may include error bits more than the ECC engine 111 may correct. In this case, the ECC engine 111 fails to correct the errors of the data, which may be referred to as an 'uncorrectable error correction code (UECC) error'. Data having the UECC error may be referred to as an "UECC data".

When data read by means of the default read voltage set includes the UECC error, the memory controller 110 conducts a read operation controlled by the first read managing unit 112. Below, a read operation that is conducted by the first managing unit 112 is referred to as a low-level read operation. The first read managing unit 112 may include information, program codes, or instructions for the low-level read operation.

When data read by means of the default read voltage set includes the UECC error, for example, the first managing unit 112 may adjust a read voltage set of the nonvolatile memory device 120. The memory controller 110 sends an address ADDR, a command CMD, and a control signal CTRL such that the nonvolatile memory device 120 performs a read operation by means of the read voltage set thus adjusted. The adjusted read voltage set may be included in the control signal CTRL or the command CMD. The ECC engine 111 detects and corrects an error of data that is read using the adjusted read voltage set.

In exemplary embodiments, the first read managing unit 112 may adjust a read voltage set the predetermined number of times, and the ECC engine 111 may detect and correct an error of data that is read using the adjusted read voltage set. For example, the memory controller 110 may repeat a set of operations the predetermined number of times, adjusting a read voltage set, reading data using the adjusted read voltage set, and correcting an error of the read data.

When an error of read data is corrected during iteration of the set of operations, the memory controller 110 outputs corrected data to an external device. When a read operation is iterated under a control of the first read managing unit 112, for example, read data or particular page data of the read data is stored at the storage circuit 114. For example, the storage circuit 114 may include a static random access memory (SRAM).

When an error of read data is not corrected after iteration of the set of operations (i.e., when the UECC error occurs), the memory controller 110 determines a starting voltage set of a read operation, which will be performed under a control of the second read managing unit 113, by means of data stored at the storage circuit 114.

For example, data stored at the storage circuit 114 corresponds to different read voltage sets, respectively. The memory controller 110 selects data, which includes the lowest error bit ratio, among data stored at the storage circuit 114. In exemplary embodiments, the lowest error bit ratio may indicate the smallest difference between data 1s and data 0s of the data. The memory controller 110 determines a read voltage set corresponding to the selected data as a starting voltage set.

For example, the determined starting voltage set is one among read voltage sets adjusted by the first read managing unit 112 and corresponds to data, which includes the least error bits, among data stored at the storage circuit 114. This means that the determined starting voltage set may be a read voltage set, nearest to a valley value of a threshold voltage distribution of memory cells, from among read voltage sets adjusted by the first read managing unit 112. A method of selecting a starting voltage set will be more fully described with reference to FIG. 11.

Afterwards, the memory controller 110 conducts a read operation by means of the determined starting voltage set and the second read managing unit 113. For example, the second read managing unit 113 performs a valley search operation using the determined starting voltage set. Below, a read operation that is conducted under a control of the second read managing unit 113 is called as a high-level read operation.

The high-level read operation generates data through two or more read operations and corrects an error of the generated data. For example, the high-level read operation has an error correction ratio higher than the low-level read operation and has an operating speed or data processing speed slower than the low-level read operation.

The determined starting voltage set is a read voltage set, nearest to a valley value of a threshold voltage distribution of memory cells, from among read voltage sets changed by the first read managing unit 112, thereby increasing the operating speed of the high-level read operation. Read operations that are performed by the first and second read managing units 112 and 113 will be more fully described with reference to FIGS. 6 through 14.

A read operation may refer to as an operation that includes a plurality of read steps and generates raw data including a plurality of page data. The read step is defined as an operation where one of a plurality of read voltages in a read voltage set is applied to a selected word line.

The low-level read operation indicates an operation where low-level raw data is read through one read operation using a read voltage set. The high-level read operation denotes an operation where high-level raw data is read through two or more read operations using a starting voltage set. In other exemplary embodiments, the low-level read operation indicates an operation where a read operation is performed n times (n being a natural number) using a read voltage set, and the high-level read operation indicates an operation where a read operation is performed m times (m being a natural number greater than n) using a starting voltage set.

The memory controller 110 may detect and correct an error of data read from the nonvolatile memory device 120. When the read data includes an UECC error, the first read managing unit 112 may adjust a read voltage set the predetermined number of times and perform a read operation by means of each of the adjusted read voltage sets. When data read using the adjusted read voltage sets includes the UECC error, the memory controller 110 determines a starting voltage set, based on data read using the adjusted read voltage sets. The second read managing unit 113 conducts a valley search operation using the determined starting voltage set and performs a read operation using the valley search result.

A conventional memory controller uses a fixed starting voltage set to perform a valley search operation. However, the memory controller 110 according to an embodiment of the inventive concept determines a starting voltage set by means of results of read operations performed by the first read managing unit 112 to increase an operating speed of the high-level read operation (i.e., valley search operation) to be performed by the second read managing unit 113.

The conventional memory controller, using a fixed starting voltage set, does not detect a valley exactly if the variation in a threshold voltage distribution of memory cells is great. However, the memory controller 110 according to an exemplary embodiment of the present inventive concept determines a starting voltage set by means of results of read operations performed by the first read managing unit 112 to change a starting voltage set. In this case, if the variation in a threshold voltage distribution of memory cells is great, a valley search operation is exactly performed because the starting voltage set is changed. Thus, a memory controller with increased performance and reliability is provided.

Figure 2:
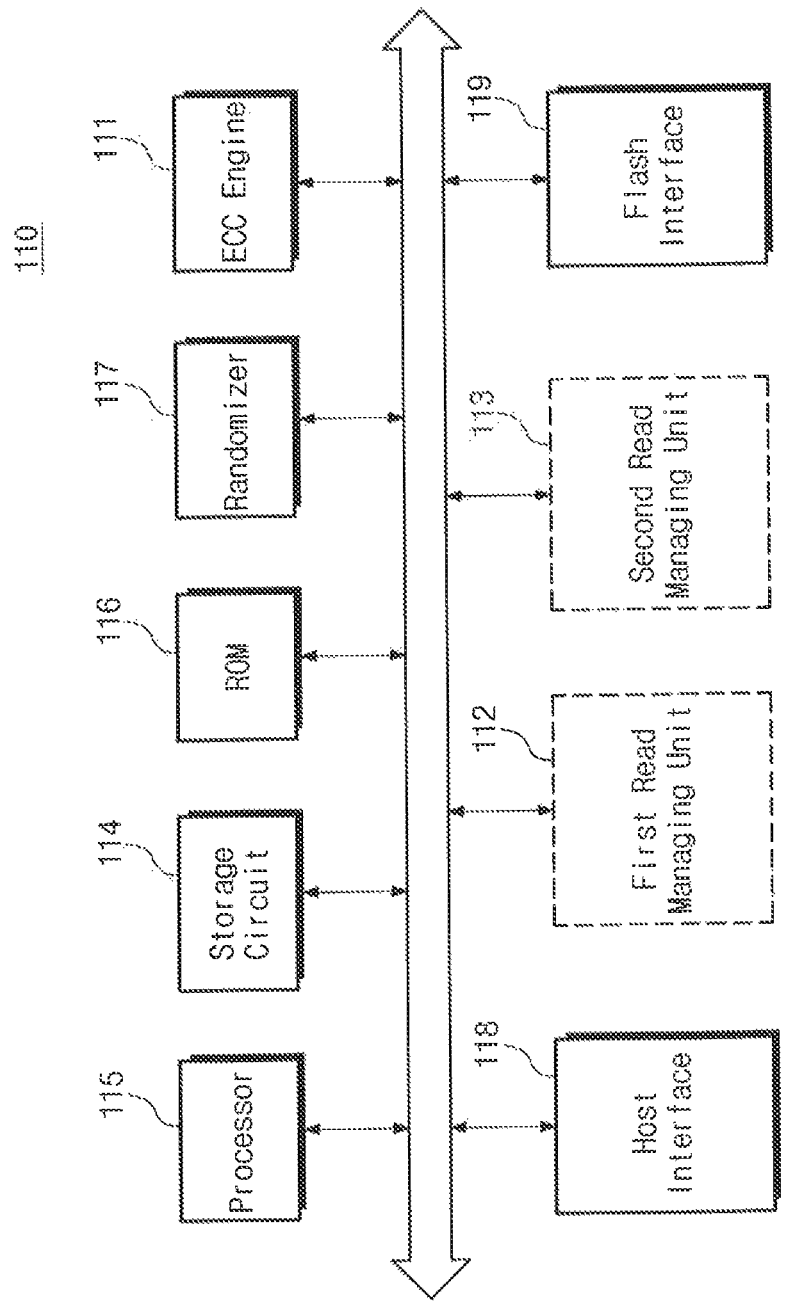
FIG. 2 is a block diagram illustrating a memory controller shown in FIG. 1 according to an exemplary embodiment of the present inventive concept.

FIG. 2 is a block diagram showing a memory controller of FIG. 1 according to an exemplary embodiment of the present inventive concept. Referring to FIGS. 1 and 2, a memory controller 110 contains an ECC engine 111, a first read managing unit 112, a second read managing unit 113, a storage circuit 114, a processor 115, a read only memory (ROM) 116, a randomizer 117, a host interface 118, and a flash interface 119. The ECC engine 111, the first and second read managing units 112 and 113, and the storage circuit 114 are described with reference to FIG. 1, and a description thereof is thus omitted.

The processor 115 controls an overall operation of the memory controller 110. In exemplary embodiments, the first and second read managing units 112 and 113 may be implemented in software and stored at the storage circuit 114. The first and second read managing units 112 and 113 stored at the storage circuit 114 may be driven by the processor 115. The ROM 116 stores a variety of information, needed for the memory controller 110 to operate, in firmware.

The randomizer 117 randomizes data to be stored at a nonvolatile memory device 120. For example, the randomizer 117 randomizes data to be stored at the nonvolatile memory device 120 by the word line.

Data randomizing is to process data such that program states of memory cells connected to a word line have the same ratio. For example, if memory cells connected to one word line are multi-level cells (MLC) each storing 2-bit data, each of the memory cells has one of an erase state and first through third program states. In this case, the randomizer 117 randomizes data such that in memory cells connected to one word line, the number of memory cells having the erase state, the number of memory cells having the first program state, the number of memory cells having the second program state, and the number of memory cells having the third program state are substantially the same as one another. For example, memory cells at which randomized data is stored have program states of which the number is equal to one another. The randomizer 117 de-randomizes data read from the nonvolatile memory device 120.

The randomizer 117 randomizes page data. For the sake of easy understanding, an ideal operation of the randomizer 117 is described. However, the inventive concept is not limited thereto. For example, the randomizer 117 randomizes data such that in memory cells connected to one word line, the number of memory cells having the erase state, the number of memory cells having the first program state, the number of memory cells having the second program state, and the number of memory cells having the third program state are approximate to the same value. For example, memory cells at which randomized data is stored have program states of which the number is similar to one another.

In a write operation, the randomizer 117 may randomize data after the ECC engine 111 completes coding operations for data, and, during read operation, the randomize 117 may de-randomize data before the ECC engine 111 performs error detecting and correcting operations for read data. Alternatively, in a write operation, the randomizer 117 may randomize data before the ECC engine 111 performs ECC coding operations for data, and, during read operation, the randomize 117 may de-randomize data after the ECC engine 111 completes an error detecting and correcting operations for read data. The ECC coding operations for data may refer to as an operation for generating an error correction code for data.

For the convenience of description, it is assumed that at the write operation, the randomizing operation of the randomizer 117 is performed before the ECC coding of the ECC engine 111 and at the read operation, the error detecting and correcting operation of the ECC engine 111 is performed before the de-randomizing operation of the randomizer 117. However, the inventive concept is not limited thereto.

The memory controller 110 communicates with an external device (e.g., a host) through the host interface 118. For example, the host interface 118 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Non-volatile memory express (NVMe), Universal Flash Storage (UFS), and etc. The memory controller 110 communicates with the nonvolatile memory device 120 through the flash interface 119.

Figure 3:
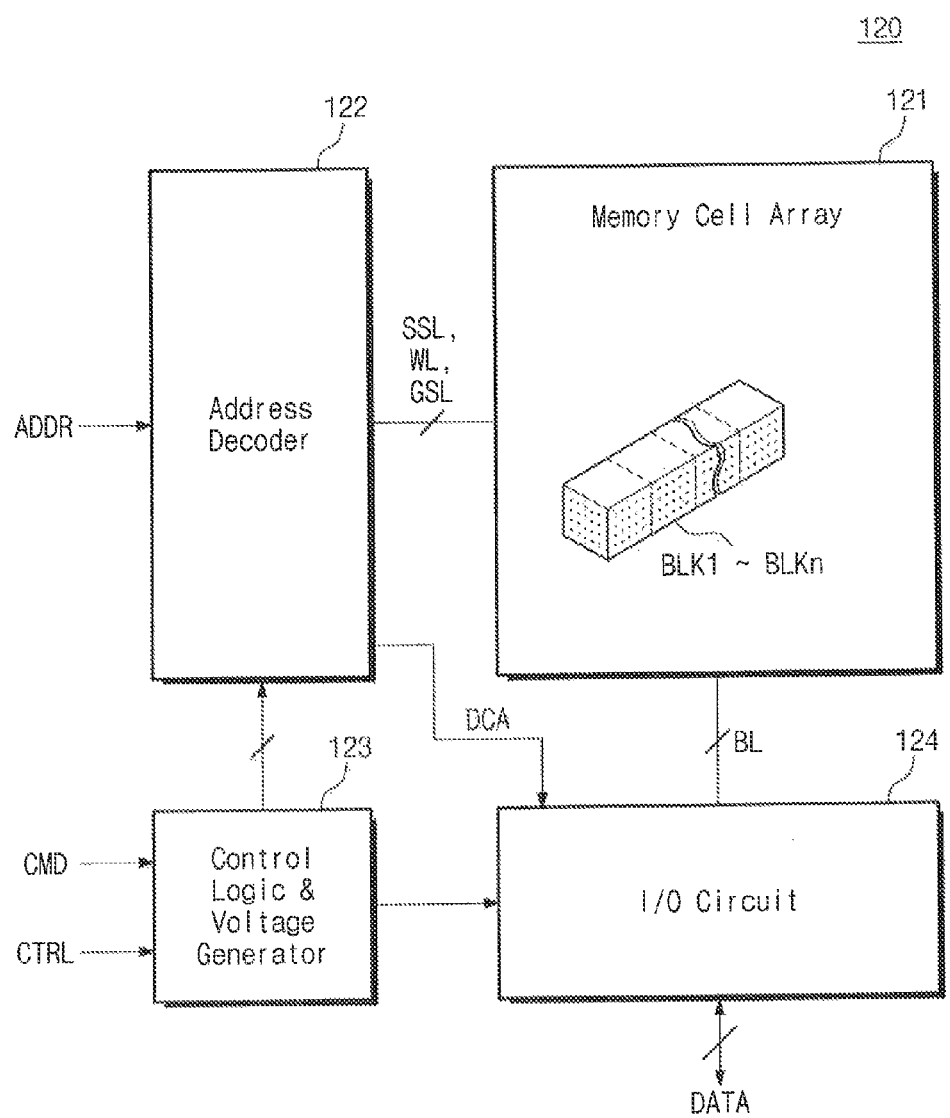
FIG. 3 is a block diagram showing a nonvolatile memory device shown in FIG. 1 according to an exemplary embodiment of the present inventive concept.

FIG. 3 is a block diagram showing a nonvolatile memory device of FIG. 1 according to an exemplary embodiment of the present inventive concept. Referring to FIGS. 1 and 3, a nonvolatile memory device 120 includes a memory cell array 121, an address decoder 122, a control logic and voltage generator block 123, and an input/output circuit 124.

The memory cell array 121 contains a plurality of memory blocks BLK1 through BLKn. Each of the memory blocks BLK1 through BLKn includes a plurality of strings each having a plurality of memory cells. The memory cells may be connected to a plurality of word lines. Each of the memory cells may be a single level cell (SLC) storing one bit or a multi-level cell (MLC) storing at least two bits.

Each of the memory blocks BLK1 through BLKn may have a three-dimensional structure. The memory block structure will be described with reference to FIG. 4.

The address decoder 122 is connected to the memory cell array 121 through word lines WL, string select lines SSL, and ground selection lines GSL. The address decoder 122 decodes an address ADDR received from a memory controller 110 to select at least one of the word lines WL. The address decoder 122 controls voltages of the word lines to perform a read or write operation on a selected word line. The address decoder 122 decodes a column address of the input address ADDR and provides the decoded column address DCA to the input/output circuit 124. The input/output circuit 124 controls bit lines BL in response to the decoded column address DCA.

The control logic and voltage generator block 123 controls the address decoder 122 and the input/output circuit 124 in response to signals from the memory controller 110. The control logic and voltage generator block 123 controls the address decoder 122 and the input/output circuit 124 in response to a command CMD and a control signal CTRL such that data is written at the memory cell array 121 or data is read from the memory cell array 121. The control logic and voltage generator block 123 also controls the address decoder 122 and the input/output circuit 124 in response to the command CMD and the control signal CTRL such that a portion of the memory cell array 121 is erased.

The control logic and voltage generator block 123 generates various voltages required for the nonvolatile memory device 120 to operate. For example, the control logic and voltage generator block 123 may generate a plurality of selection read voltages, a plurality of non-selection read voltages, a plurality of program voltages, a plurality of pass voltages, a plurality of erase voltages, and so on and may transfer the generated voltages to the address decoder 122 and the memory cell array 121.

The control logic and voltage generator block 123 may adjust levels of read voltages under a control of the memory controller 110. For example, the control logic and voltage generator block 123 may generate one of a plurality of read voltage sets under the control of the memory controller 110. The address decoder 122 may supply the read voltage set thus generated to a selected one of a plurality of word lines.

The input/output circuit 124 is connected to the memory cell array 121 through the bit lines BL. The input/output circuit 124 controls the bit lines BL such that data from the memory controller 110 is written at the memory cell array 121. The input/output circuit 124 also controls the bit lines such that data written at the memory cell array 121 is output.

The input/output circuit 124 may contain the following: a page buffer (or, a page register), a column selector, a data buffer, and a global buffer, although not shown. The input/output circuit 124 may also contain the following: a sense amplifier, a write driver, a column selector, and a data buffer, although not shown.

Figure 4:
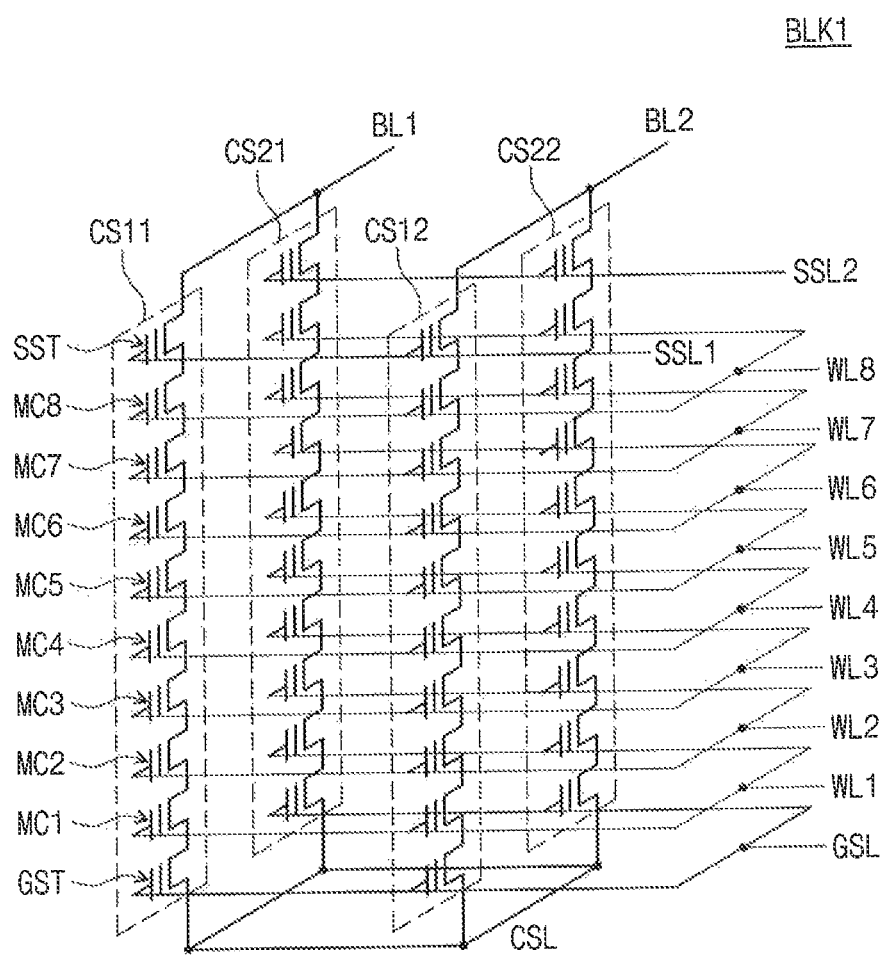
FIG. 4 is a circuit diagram showing a first memory block of a memory cell array shown in FIG. 3 according to an exemplary embodiment of the present inventive concept.

FIG. 4 is a circuit diagram showing a first memory block of a memory cell array of FIG. 3 according to an exemplary embodiment of the present inventive concept. For the convenience of description, a first memory block BLK1 will be described with reference to FIG. 4. However, the inventive concept is not limited thereto. The remaining memory blocks BLK2 to BLKn may also have the same structure as the first memory block BLK1.

Referring to FIGS. 3 and 4, the first memory block BLK1 includes a plurality of cell strings CS11, CS12, CS21 and CS22. The cell strings CS11, CS12, CS21 and CS22 are arranged along a row direction and a column direction to form rows and columns.

Each of the cell strings CS11, CS12, CS21 and CS22 includes a plurality of cell transistors. The cell transistors includes a string select transistor SST, a plurality of memory cells MC1~MC8 and a ground select transistor GST. In each of the strings CS11, CS12, CS21 and CS22, the string select transistor SST is connected to a string select line SSL. The string select line SSL may be divided into first and second string select lines SSL1 and SSL2. In each of the strings CS11, CS12, CS21 and CS22, the memory cells MC1~MC8 are connected to word lines WL1~WL8, respectively. Word lines having the same height are connected to each other. In each of the strings CS11, CS12, CS21 and CS22, the ground select transistor GST is connected to a ground select line GSL. Each cell string is connected between a bit line BL and a common source line CSL. For example, the string select transistor SST is connected to the bit line BL and the ground select transistor GST is connected to the common source line CSL.

Cell strings disposed in the same column are connected to the same bit line. For example, the cell strings CS11 and CS21 are connected to a first bit line BL1. The cell strings CS12 and CS22 are connected to a second bit line BL2.

Cell strings disposed in the same row are connected to the same string select line. For example, the cell strings CS11 and CS12 are connected to the first string select line SSL1. The cell strings CS21 and CS22 are connected to the second string select line SSL2.

Each of the cell strings CS11, CS12, CS21 and CS22 is stacked in a direction perpendicular to a substrate (not shown). For example, the ground select transistor GST, the memory cells MC1~MC8 and the string select transistor SST may be stacked in the direction perpendicular to the substrate to be formed. In exemplary embodiments, the memory cells MC1~MC8 may be formed of charge trap flash (CTF) memory cells.

The inventive concept is not limited thereto. For example, the number of rows of cell strings may be increased or reduced. As the number of rows of cell strings is changed, the number of string select lines or ground select lines connected to rows of the cell strings and the number of cell strings connected to one bit line may also be changed.

For example, the number of columns of cell strings may be increased or reduced. As the number of columns of cell strings is changed, the number of bit lines connected to columns of the cell strings and the number of cell strings connected to one string select line may also be changed.

For example, a height of cell strings may be increased or reduced. For example, the number of memory cells being stacked in each cell string may be increased or reduced. As the number of memory cells being stacked in each cell string is changed, the number of word lines may also be changed.

For example, the number of string select transistors or ground select transistors being provided each cell string may be increased. For example, as the number of string select transistors or ground select transistors being provided each cell string is changed, the number of string select lines or ground select lines may also be changed. In the case that the number of string select lines or ground select lines is increased, the string select lines or the ground select lines may be stacked in the same form as the memory cells MC1~MC8.

Write and read operations may be performed by a row unit of the cell strings CS11, CS12, CS21 and CS22. The cell strings CS11, CS12, CS21 and CS22 may be selected by one row unit by the string select lines SSL1 and SSL2.

In a selected row of the cell strings CS11, CS12, CS21 and CS22, write and read operations may be performed by a page unit. The page may refer to one row of memory cells connected to one word line. For example, the page may be a unit of data stored in one row of memory cells connected to one word line. In a selected row of the cell strings CS11, CS12, CS21 and CS22, memory cells may be selected by a page unit by the word lines WL1~WL8.

Figure 5:
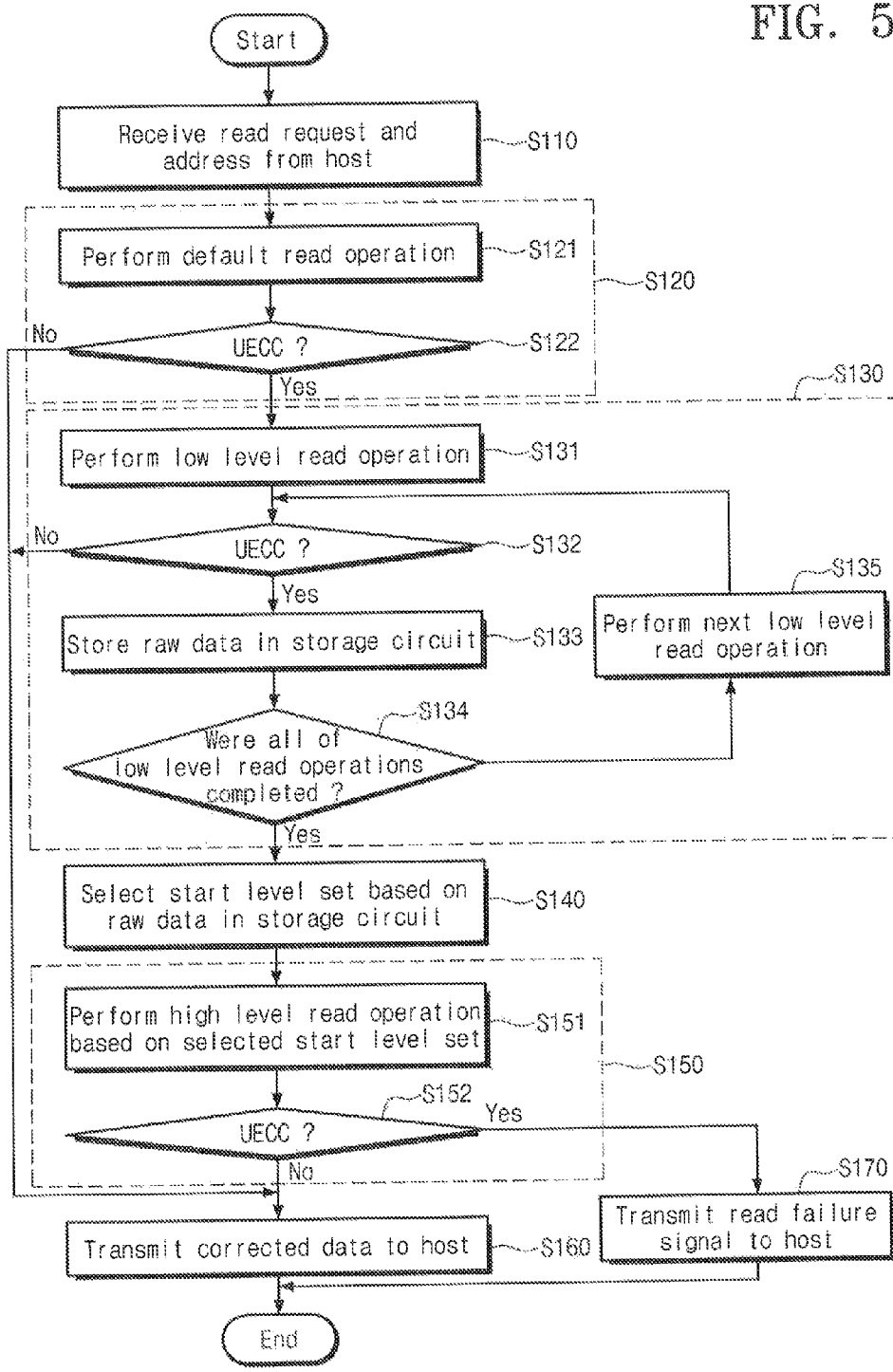
FIG. 5 is a flow chart showing an operation of a memory controller shown in FIG. 1 according to an exemplary embodiment of the present inventive concept.

FIG. 5 is a flow chart showing an operation of a memory controller of FIG. 1 according to an exemplary embodiment of the present inventive concept. For the convenience of description, it is assumed that a first read managing unit 112 includes a PreDefined Table (PDT). The first read managing unit 112 controls a read operation (or, the low-level read operation) using the PDT. However, the inventive concept is not limited thereto. For example, the first read managing unit 112 may include information about methods of selecting any other voltage sets such as a program time stamp table (PTS).

A read operation (or, the high-level read operation) managed by a second read managing unit 113 is a read operation based on a valley value detected by a valley search operation. However, the inventive concept is not limited thereto.

A read voltage set may include a plurality of read voltages for determining program states of memory cells. The read voltage set may be adjusted by a memory controller 110. Data that is read from a nonvolatile memory device 120 by means of a read voltage set may be referred to as "raw data". The raw data is data before error detection and correction is performed by the ECC engine 111 of FIG. 1.

Referring to FIGS. 1 and 5, in step S110, the memory controller 110 receives a read request and an address from a host.

In step S120, the memory controller 110 performs a default read operation, and step S120 contains steps S121 and S122.

When the read request is received, in step S121, the memory controller reads a page (or, memory cells connected to a word line) corresponding to the received address using a default read voltage set.

In step S122, the memory controller 110 determines whether data (hereinafter, referred to as default raw data) read using the default read voltage set includes an UECC error. For example, an ECC engine 111 detects and corrects errors of the default raw data.

When errors of the default raw data are all corrected (i.e., no UECC error exists), in step S160, the memory controller 110 proceeds to step S160 to send the corrected data to the host.

In exemplary embodiments, the memory controller 110 de-randomizes the corrected data and sends the de-randomized data to the host. Alternatively, the memory controller 110 may de-randomize the default raw data, and then, detect and correct errors of the default raw data.

When errors of the default raw data are not corrected (i.e., an UECC error exists), the default raw data or partial page data of the default raw data is stored at a storage circuit 114. Alternatively, the memory controller 110 may store the default raw data at the storage circuit 114 before an error correction operation of the ECC engine 111 is performed on the default raw data. If a de-randomizing operation is performed before an error correction operation, the memory controller 110 may store the default raw data at the storage circuit 114 before the de-randomizing operation of the randomizer 117.

In step S130, the memory controller 110 performs a low-level read operation by means of a first read managing unit 112. Step S130 contains steps S131 through S135.

In step S131, the memory controller 110 performs a low-level read operation by means of the first read managing unit 112. For example, the first read managing unit 112 may include a PreDefined table (PDT) that contains information about a plurality of read voltage sets. The memory controller 110 sets a read voltage set with a first read voltage set, based on the PDT of the first read managing unit 112. The memory controller 110, then, reads data stored at the nonvolatile memory device 120 using the first read voltage set. Hereinafter, data read using the first read voltage set may be referred to as first raw data.

In step S132, the memory controller 110 determines whether the first raw data includes an UECC error using the ECC engine 111. When an error of the first raw data is detected and corrected (i.e., no UECC error exists), the method proceeds to step S160.

When an error of the first raw data is not corrected (i.e., an UECC error exists), in step S133, the memory controller 110 stores the first raw data at the storage circuit 114. Alternatively, the memory controller 110 may store the first raw data at the storage circuit 114 before an error correction operation of the ECC engine 111 is performed on the first raw data.

In step S134, the memory controller 110 determines whether a low-level read operation is completed, that is, whether the low-level read operation managed by the first read managing unit 112 is performed as many as the predetermined number of times. For example, the memory controller 110 determines whether read voltage sets included in the PDT of the first read managing unit 112 are all used.

When the low-level read operation is not completed, the method proceeds to step S135 where the memory controller 110 performs a next read operation by means of the first read managing unit 112. For example, if an unused read voltage set of the PDT exists, the method proceeds to step S135. In step S135, the memory controller 110 adjusts the read voltage set and reads data from the nonvolatile memory device 120 by means of the adjusted read voltage set as a second read voltage set.

The memory controller 110 iterates steps S132 through S135 until an error of read raw data is detected and corrected or until the voltage sets of the PDT are used up without correcting the error. When an error of the raw data is corrected, the method proceeds to step S160.

Alternatively, the memory controller 110 iterates steps S132 through S135 until the low-level read operation managed by the first read managing unit 112 is performed the predetermined number of times or the read voltage sets included in the PDT of the first read managing unit 112 are all used.

The low-level read operation corresponding to step S130 will be described with reference to FIGS. 9 and 10.

When the low-level read operation managed by the first read managing unit 112 is performed the predetermined number of times or the read voltage sets included in the PDT of the first read managing unit 112 are all used, in step S140, the memory controller 110 selects a starting voltage set, based on a plurality of raw data stored at the storage circuit 114.

For example, the default raw data and a plurality of raw data may be stored at the storage circuit 114 through steps S120 and S130. The plurality of raw data may be data that is read using different read voltage sets. The memory controller 110 selects raw data having the lowest error bit ratio, from among the default raw data and the plurality of raw data and selects a read voltage set corresponding to the selected raw data as a starting voltage set. An operation corresponding to step S140 will be more fully described with reference to FIG. 11.

In step S150, the memory controller 110 performs a high-level read operation using the selected starting voltage set. For example, a second read managing unit 113 includes information or a program code for a valley search operation. For example, the memory controller 110 detects a valley value of a threshold voltage distribution of memory cells connected to a selected word line using the selected starting voltage set. The memory controller 110 performs a read operation depending on the detected valley value to read raw data from the nonvolatile memory device 120. The memory controller 110 detects and corrects errors of the read raw data. An operation corresponding to step S150 will be more fully described with reference to FIGS. 12 and 13.

When errors of the read raw data are corrected, the method proceeds to step S160. When errors of the read raw data is not corrected (i.e., the read raw data includes an UECC error), the memory controller 110 issues a read failure signal to the host. Although not shown in figure, when errors of the read raw data is not corrected, the memory controller 110 may further perform a read operation of which the reliability is higher than that of a read operation managed by the second read managing unit 113.

Figure 6:
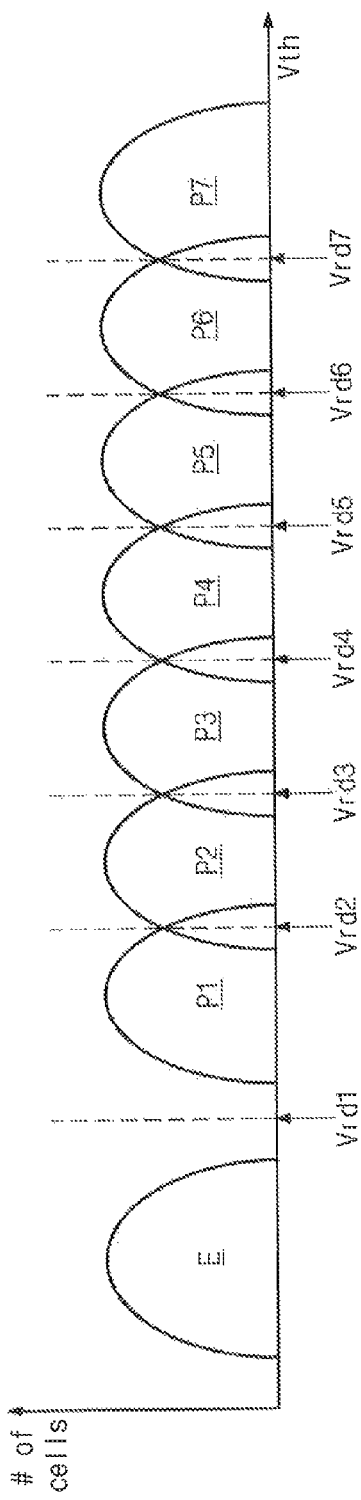
FIGS. 6 and 7 are threshold distributions showing step S120 of FIG. 5 according to an exemplary embodiment of the present inventive concept.
Figure 7:
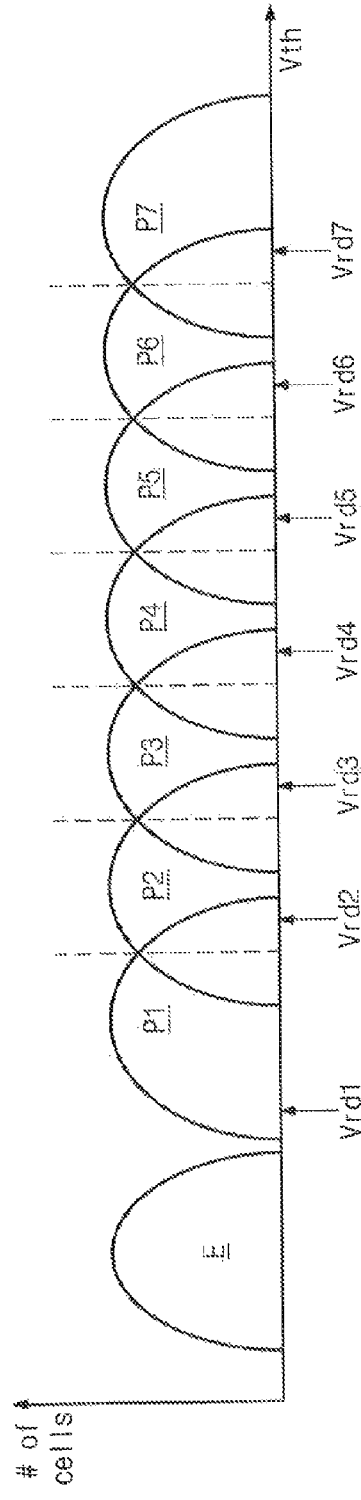
Figure 8:
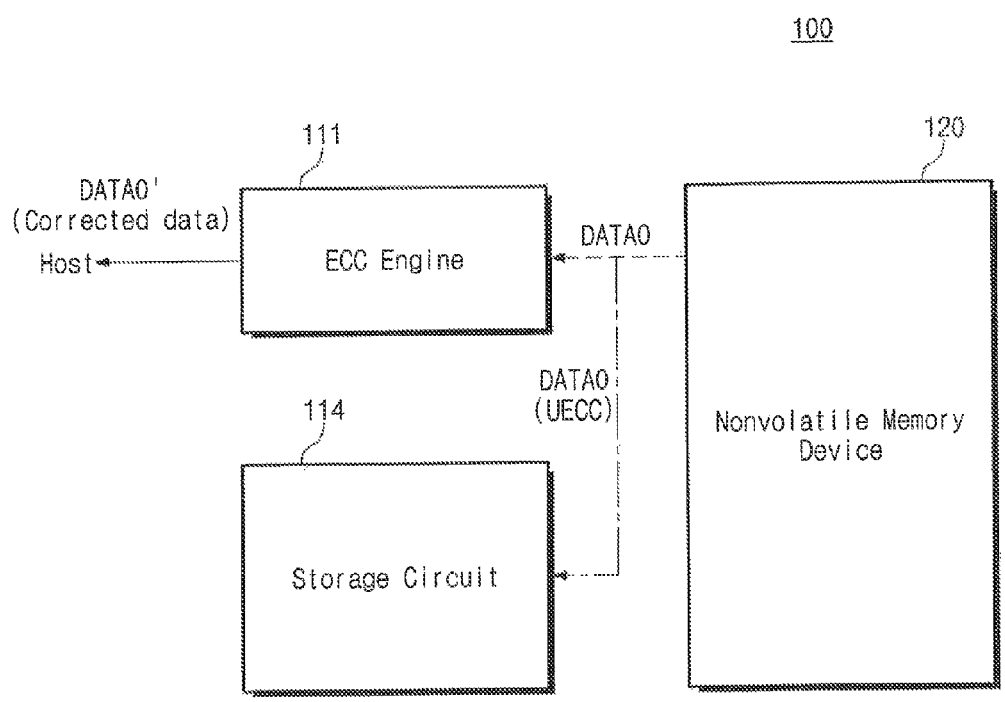
FIG. 8 is a diagram for showing step S120 of FIG. 5 according to an exemplary embodiment of the present inventive concept.

FIGS. 6 through 7 show threshold distributions for showing step S120 of FIG. 5 according to an exemplary embodiment of the present inventive concept. FIG. 8 is a block diagram for showing step S120 of FIG. 5 according to an exemplary embodiment of the present inventive concept. FIG. 9 is a threshold diagram for showing step S130 of FIG. 5. FIG. 10 is a block diagram for showing step S130 of FIG. 5 according to an exemplary embodiment of the present inventive concept. For the convenience of description, it is assumed that memory cells of a nonvolatile memory device 120 are triple level cells (TLC) each storing three bits and a read voltage set for determining program states of memory cells includes seven read voltages. Also, it is assumed that a first read managing unit 112 contains a PreDefined table (PDT) and adjusts a read voltage set using the PDT. However, the inventive concept is not limited thereto.

Referring to FIGS. 1, 5, and 6, each memory cell of the nonvolatile memory device 120 has one of an erase state E and first through seventh program states P1 through P7. Under a control of a memory controller 110, the nonvolatile memory device 120 determines program states of memory cells using a default read voltage set Vrd1 through Vrd7 and outputs default raw data DATA0 as the determination result.

Voltage levels of the default read voltage set Vrd1 through Vrd7 may be predetermined depending on cell characteristics. For example, voltage levels of the default read voltage set Vrd1 through Vrd7 are predetermined depending on a threshold voltage distribution just after memory cells are programmed. Alternatively, voltage levels of the default read voltage set Vrd1 through Vrd7 are predetermined depending on a threshold voltage distribution after memory cells are programmed and then a time elapses (i.e., memory cells are stabilized).

Referring to FIGS. 7 and 8, a threshold voltage distribution of memory cells varies due to physical characteristics of memory cells or external factors as an elapsed time after the memory cells are programmed, as illustrated in FIG. 7. For example, CTF memory cells may experience IVS (initial verify shift) that a threshold voltage distribution of the memory cells shifts toward a relatively low voltage. For this reason, the default raw data read through a read operation using the default read voltage set Vrd1 through Vrd7 may include an error.

The memory controller 110 detects and corrects an error of the default raw data DATA0 thus read. When errors of the default raw data DATA0 are corrected, the memory controller 110 sends the corrected data DATA0' to a host. In exemplary embodiments, the memory controller 110 de-randomizes the corrected data DATA0' and sends the de-randomized data to the host.

When errors of the default raw data DATA0 are not corrected (i.e., the number of errors in the default raw data DATA0 exceeds an error correction capacity of the ECC engine 111 or the default raw data DATA0 contains an UECC error), the memory controller 110 stores the default raw data DATA0 at a storage circuit 114 and retries a low-level read operation by means of a first read managing unit 112.

Referring to FIGS. 1, 5, 9, and 10, the first read managing unit 112 contains the PDT. The PDT includes a plurality of read voltage sets SET1 through SETn, which have predetermined read voltages (Vrd11~Vrd17) through (Vrdn1~Vrdn7) for determining program states of memory cells.

For example, each of the read voltages Vrd11 through Vrdn1 is used to determine an erase state E and a first program state P1, each of the read voltages Vrd12 through Vrdn2 is used to determine a second program state P2, and each of the read voltages Vrd13 through Vrdn3 is used to determine a third program state P3. Each of the read voltages Vrd14 through Vrdn4 is used to determine a fourth program state P4, and each of the read voltages Vrd15 through Vrdn5 is used to determine a fifth program state P. Each of the read voltages Vrd16 through Vrdn6 is used to determine a sixth program state P6, and each of the read voltages Vrd17 through Vrdn7 is used to determine a seventh program state P7.

Figure 9:
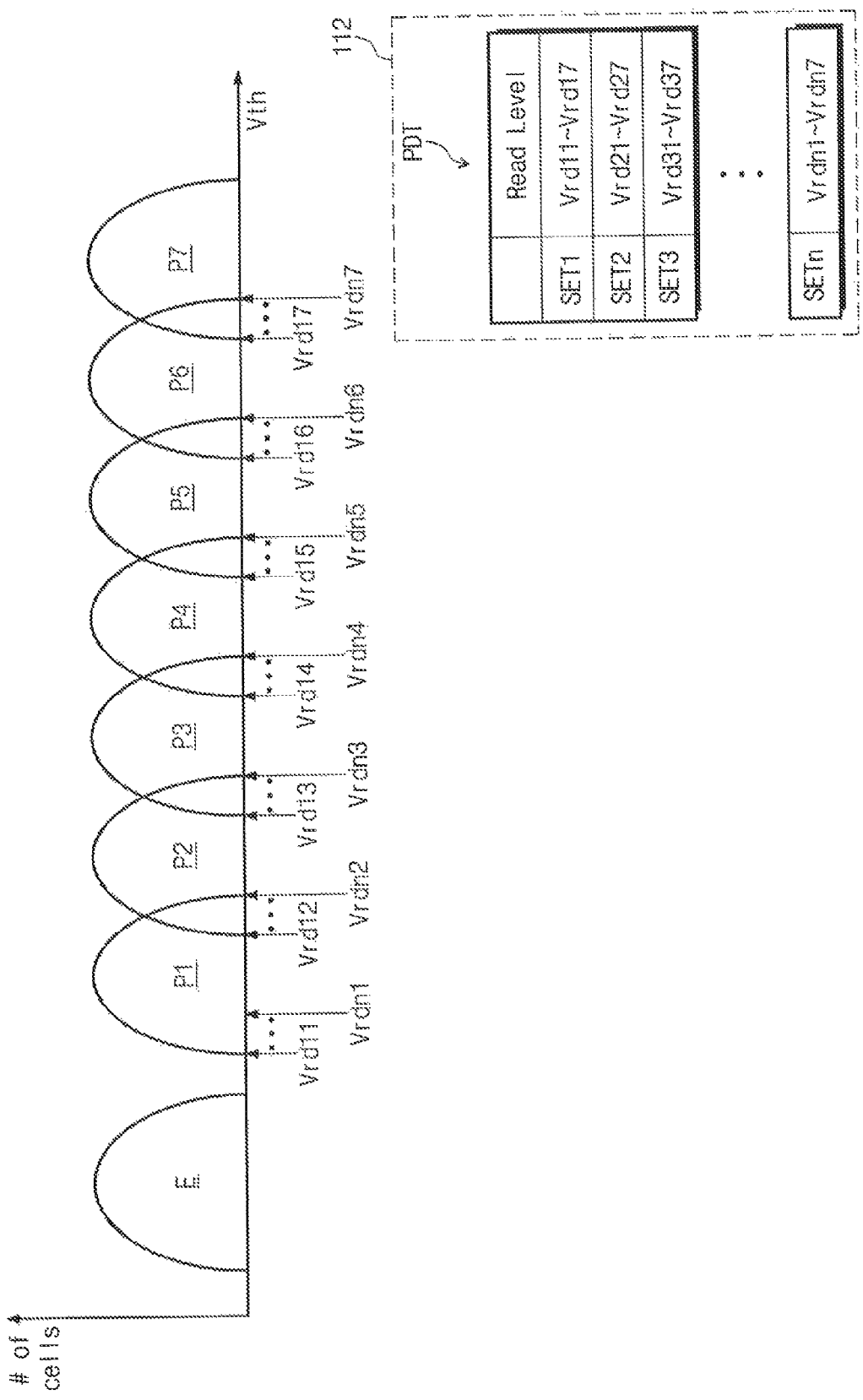
FIG. 9 is a threshold distribution diagram showing step S130 of FIG. 5 according to an exemplary embodiment of the present inventive concept.

In FIG. 9, a plurality of read voltages is shown, for example. The present inventive concept is not limited thereto. The read voltages may be adjusted according to a plurality of read voltage sets. For example, a read level Vrd17 may be lower than a read level Vrdn6.

As described with reference to FIG. 5, when an error of the default raw data DATA0 is not corrected (i.e., the number of errors in the default raw data DATA0 exceeds an error correction capacity of the ECC engine 111 or an UECC error is included), the memory controller 110 adjusts a read voltage set by means of the first read managing unit 112. For example, the memory controller 110 sets a read voltage set with a first read voltage set SET1 included in the PDT. The memory controller 110, then, performs steps S131 through S134 of FIG. 5.

Figure 10:
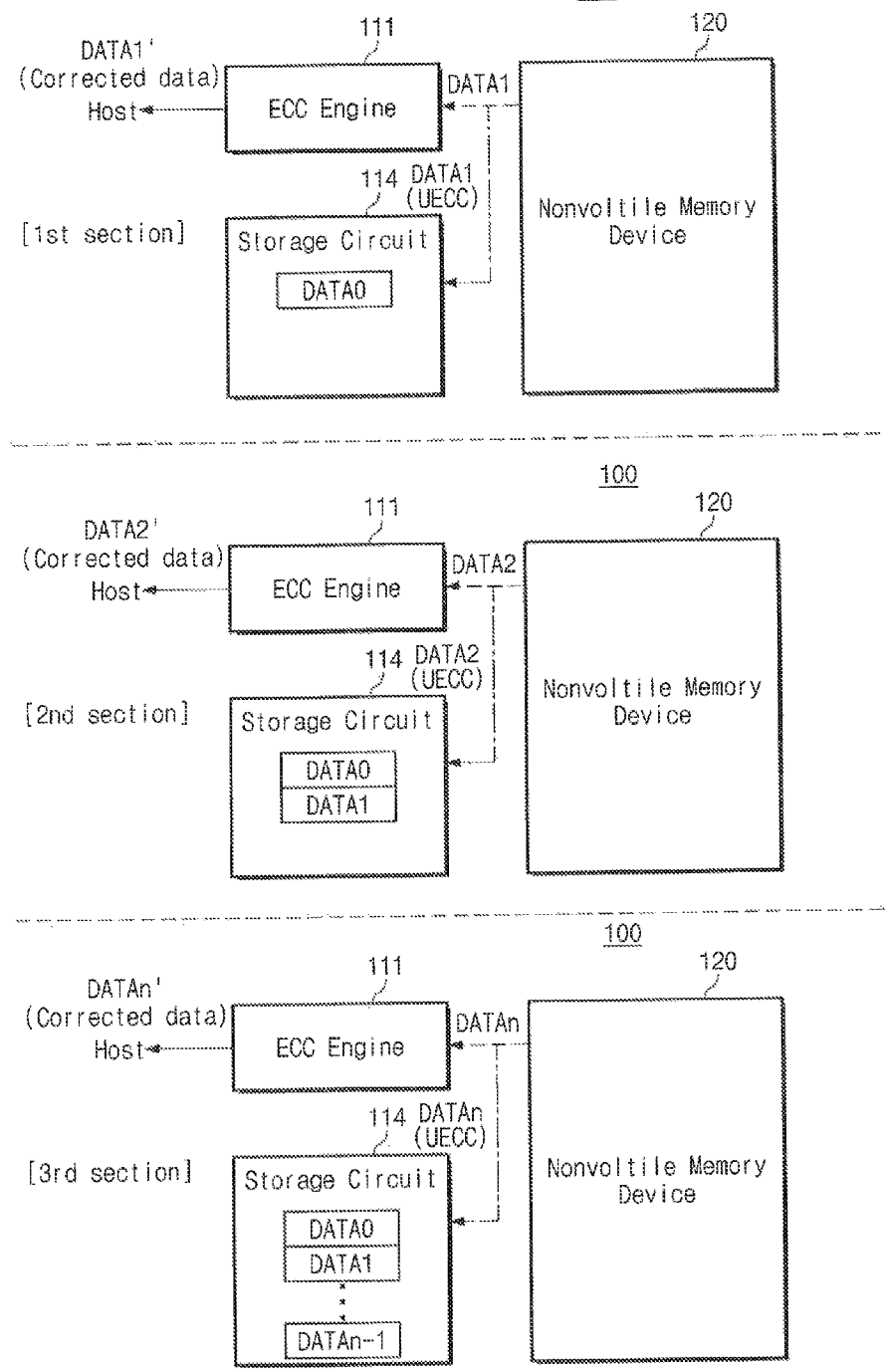
FIG. 10 is diagram for showing step S130 of FIG. 5 according to an exemplary embodiment of the present inventive concept.

As shown in the first section of FIG. 10, the memory controller 110 reads first raw data DATA1 using the first read voltage set SET1. The ECC engine 111 detects and corrects an error of the first raw data DATA1 thus read. When an error of the first raw data DATA1 is corrected, the memory controller 110 sends the corrected data DATA1' to the host.

When an error of the first raw data DATA1 is not corrected, the memory controller 110 stores the first raw data DATA1 at the storage circuit 114 and sets the read voltage set with a second read voltage set SET2. The memory controller 110 reads second raw data DATA2 using the second read voltage set SET2. The memory controller 110, then, repeats steps S132 through S134 using the second read voltage set SET2. As shown in the second section of FIG. 10, the memory controller 110 reads second raw data DATA2 using the second read voltage set SET2. The ECC engine 111 detects and corrects an error of the second raw data DATA2 thus read. When an error of the second raw data DATA2 is corrected, the memory controller 110 sends the corrected data DATA2' to the host. When an error of the second raw data DATA2 is not corrected, the memory controller 110 stores the second raw data DATA2 at the storage circuit 114.

The memory controller 110 may iterate the above-described process (adjusting a read voltage set and iterating the above-described operations) until an error of raw data read from the nonvolatile memory device 120 is corrected.

The PDT of the first read managing unit 112 contains a plurality of read voltage sets SET1 through SETn. The memory controller 110, as shown in the third section of FIG. 10, may perform a read operation n times using the read voltage sets SET1 through SETn.

Figure 11:
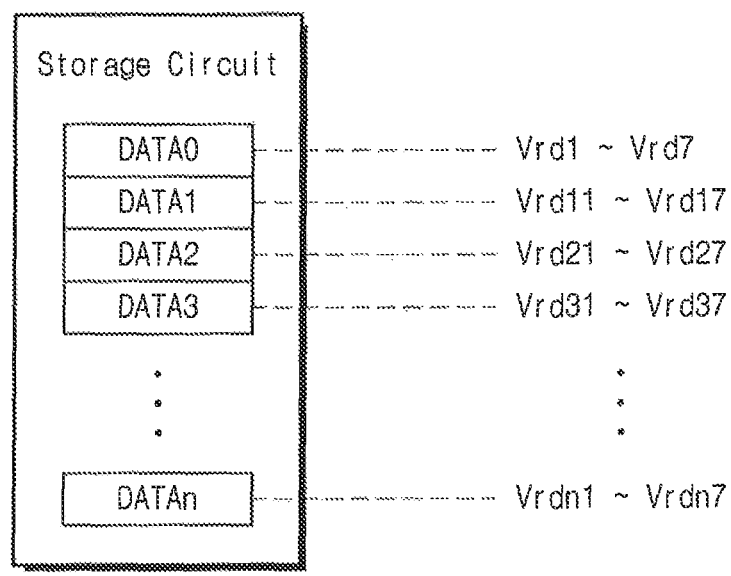
FIG. 11 is a diagram showing step S140 of FIG. 5 according to an exemplary embodiment of the present inventive concept.

FIG. 11 is a diagram for showing step S140 of FIG. 5 according to an exemplary embodiment of the present inventive concept. Referring to FIGS. 10 and 11, when a data error is not corrected even though a read operation managed by a first read managing unit 112 is performed n times, as illustrated in FIG. 11, default raw data DATA0 and first through n-th raw data DATA1 through DATAn are stored at a storage circuit 114.

As described above, the default raw data DATA0 and the first through n-th raw data DATA1 through DATAn are data read from memory cells, connected to a word line, using different read voltage sets. For example, the default raw data DATA0 and the first through n-th raw data DATA1 through DATAn correspond to data stored in the same page read using different read voltage sets. For example, the default raw data DATA0 is data read using a default read voltage set Vrd1 through Vrd7, and first through n-th raw data DATA1 through DATAn are data using first through n-th read voltage sets (Vrd11~Vrd17) through (Vrdn1~Vrdn7).

As described with reference to FIG. 2, the memory controller 110 contains a randomizer 117. The randomizer 117 randomizes data to be stored at a nonvolatile memory device 120. For example, the randomizer 117 may randomizes data to be stored in each page so that each page has substantially the same number of program states of memory cells. In this case, raw data with the lowest error bit rate may be raw data having the smallest difference among the numbers of program states, among the default raw data DATA0 and the first through n-th raw data DATA1 through DATAn stored at the storage circuit 114.

For example, it is assumed that each memory cell is TLC storing 3 bits and each page has eight hundred (800) memory cells. For example, eight hundred memory cells are connected to a word line. When randomized data is stored at memory cells connected to a word line, the number of memory cells having each of an erase state and first through seventh program states is one hundred (100).

In this case, when memory cells connected to a word line are read using an ideal read voltage set, as described above, the number of memory cells having each program state is one hundred (100). However, when memory cells connected to a word line are read using a read voltage set other than the ideal read voltage set, as described above, the number of memory cells for each program state may be different from one hundred (100). For example, the number of error bits may be a difference between the numbers of memory cells having respective program states. As described above, a read voltage set that causes the smallest difference between the numbers of memory cells having respective program states is determined as a starting voltage set for the high-level read operation. For the convenience of description, data is ideally randomized, as described above. However, the inventive concept is not limited thereto. For example, the number of each program state in randomized data may be approximately one hundred (100).

The memory controller 110 selects, as a starting voltage set, a read voltage set used to read raw data, which causes the smallest difference between the numbers of memory cells having respective program states, from among the default raw data DATA0 and the first through n-th raw data DATA1 through DATAn stored at the storage circuit 114. For example, a read voltage set causing the lowest error bit ratio is selected as a starting voltage set.

The memory controller 110 may select a starting voltage set among read voltage sets used for reading the default raw data DATA0 and the first through n-th raw data DATA1 through DATAn from uncorrected memory cells in the steps S120. For example, when memory cells are TLCs, each of the default raw data DATA0 and the first through n-th raw data DATA1 through DATAn may include the Least Significant Bit (LSB) page data, the Central Significant Bit (CSB) page data, and the Most Significant Bit (MSB) page data. For TLCs, each memory cell stores three bits of which the leftmost bit is MSB, the rightmost bit is LSB and the center bit is CSB. It is assumed that each page is controlled to store information of the same bit position. For example, the MSB page is formed of MSBs; the LSB page is formed of LSBs; and the CSB page is formed of CSBs. For TLCs, if the data of each page is ideally randomized, the number of respective program states is the same. In addition, if each page is controlled to store one of three pages—MSB page, LSB page, and CSB page and is ideally randomized, each page include half data 0s and half data 1s.

For the convenience of description, it is assumed that only MSB page data is stored at the storage circuit 114. As described above, the data stored at the nonvolatile memory device 120 is randomized data, and if data read using a read voltage has the smallest difference between the numbers of program states (or between the numbers of data 0s and data 1s of the MSB page data in the raw data), such read voltage is selected as a starting voltage set.

Figure 12:
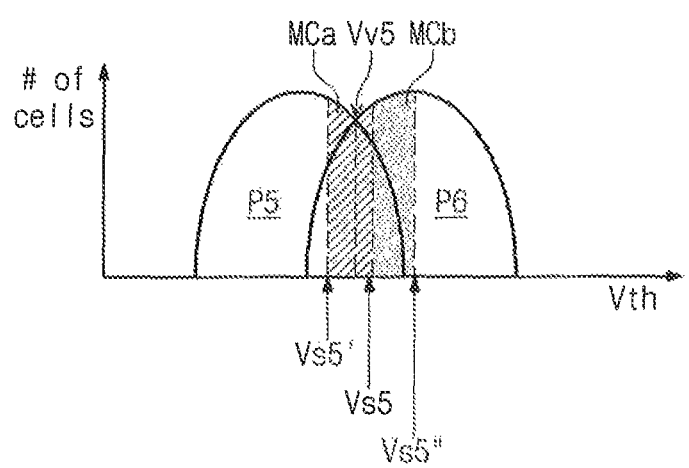
FIGS. 12 and 13 are threshold voltage distributions showing step S150 of FIG. 5 according to an exemplary embodiment of the present inventive concept.
Figure 13:
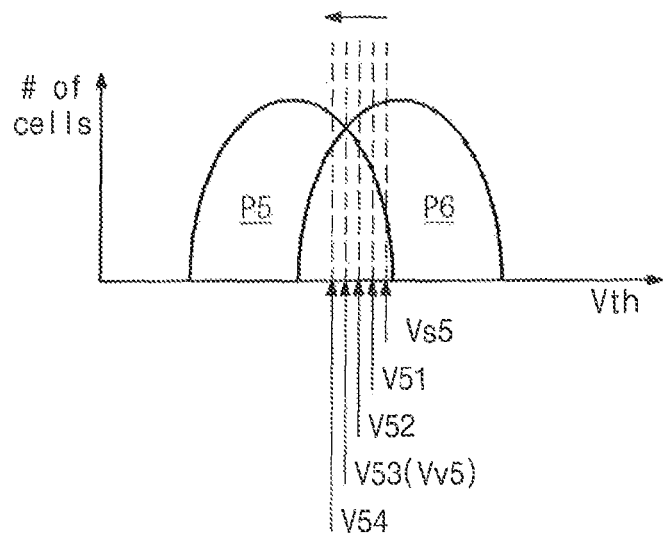

FIGS. 12 and 13 are diagrams for showing step S150 of FIG. 5 according to an exemplary embodiment of the present inventive concept. A valley search operation will be exemplarily described with reference to FIGS. 12 and 13. For brevity of description, an operation of searching a valley value between fifth and sixth program states P5 and P6 will be described. However, the inventive concept is not limited thereto.

When an error is not corrected at a read operation managed by the first read managing unit 112, the memory controller 110 performs a high-level read operation using the selected starting voltage set and the second read managing unit 113.

In exemplary embodiments, the second read managing unit 113 may includes information, or a program codes, or program instructions for the valley search operation. The memory controller 110 conducts the valley search operation using the selected starting voltage set. The memory controller 110, for example, selects the starting voltage set as described with reference to FIG. 11. Although not shown in figure, the starting voltage set may include first through seventh starting voltages Vs1 through Vs7, each of which is used as a starting voltage at an operation of searching a valley value between threshold voltage distributions of memory cells. For example, as illustrated in FIG. 12, the fifth starting voltage Vs5 is used as a starting voltage for searching a valley value between the fifth and sixth program states P5 and P6.

The memory controller 110 performs a read operation using the fifth starting voltage Vs5 to search a valley value between the fifth and sixth program states P5 and P6. A read operation is, then, performed using a voltage Vs5' lower by a predetermined level than the fifth starting voltage Vs5; a read operation is performed using a voltage Vs5" higher by a predetermined level than the fifth starting voltage Vs5.

The memory controller 110 searches a valley value Vv5 depending on data read using the fifth starting voltage Vs5, data read using the voltage Vs5', and data read using the voltage Vs5". For example, the memory controller 110 detects memory cells MCa, each having a threshold voltage between the fifth starting voltage Vs5 and the voltage Vs5', depending on the data read using the fifth starting voltage Vs5 and the data read using the voltage Vs5'. Moreover, the memory controller 110 detects memory cells MCb, each having a threshold voltage between the fifth starting voltage Vs5 and the voltage Vs5", depending on the data read using the fifth starting voltage Vs5 and the data read using the voltage Vs5".

The memory controller 110 detects the valley value Vv5 depending on the number of detected memory cells MCa and the number of detected memory cells MCb. For example, the memory controller 110 may calculate a ratio between the numbers of detected memory cells MCa and MCb, and detect the valley value Vv5 based on the calculated ratio and the starting voltage Vs5. More specifically, as illustrated in FIG. 12, the number of detected memory cells MCa is smaller than the number of detected memory cells MCb. In this case, the valley value Vv5 is lower than the starting voltage Vs5 being median value between the voltages Vs5' and Vs5".

The memory controller 110 may detect other valley values depending on a manner similar to the above-described manner and perform read operations by means of the detected valley values.

Referring to FIG. 13, the memory controller 110 performs a read operation using a fifth starting voltage Vs5. The memory controller 110, then, performs a read operation using a voltage V51 lower by a predetermined level than the fifth starting voltage Vs5. The memory controller 110 detects memory cells, each having a threshold voltage between the fifth starting voltage Vs5 and the voltage V51, depending on the data read using the fifth starting voltage Vs5 and the data read using the voltage V51.

The memory controller 110 iterates a read operation with a read voltage with lowered voltages Vs52, Vs53, and Vs54. The memory controller 110 detects memory cells, each having a threshold voltage between the two voltages (e.g., (Vs51 and Vs52), (Vs52 and Vs53), and (Vs53 and Vs54)), depending on the read data. The memory controller 110 detects the valley value Vv5 depending on variations in the numbers of memory cells thus detected. For example, the number of memory cells having threshold voltage between two voltages V52 and V53 is less than the number of memory cells having threshold voltage between two voltages V51 and V52, and greater than the number of memory cells having threshold voltage between two voltages V53 and V54. In this case, the memory controller may determine the voltage V53 as valley value, but the voltage V53 may be not exactly valley value for fifth and sixth program states P5 and P6.

An operating method described with reference to FIGS. 12 and 13 is exemplary. However, the inventive concept is not limited thereto. For example, the memory controller 110 may perform a valley search operation different from that described with reference to FIGS. 12 and 13. For example, the memory controller 110 may perform a valley search operation based on a regression analysis using the read data. Also, the memory controller 110 may select an optimal read level by means of any other operating method except the valley search operation and perform a read operation using the optimal read level thus selected.

Figure 14:
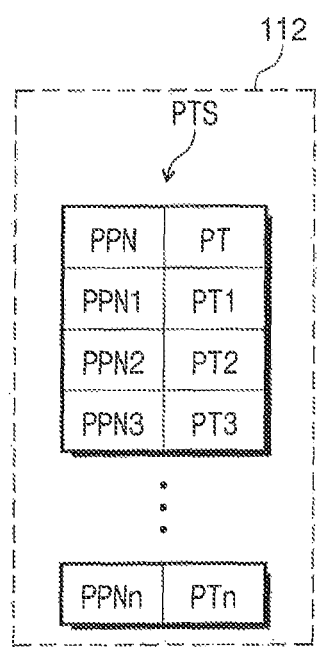
FIG. 14 is a diagram showing step S130 of FIG. 5 according to an exemplary embodiment of the present inventive concept.

FIG. 14 is a diagram for showing step S130 of FIG. 5 according to an exemplary embodiment of the present inventive concept. Referring to FIGS. 1, 5, and 14, the first read managing unit 112 contains a program time stamp table PTS. The program time stamp table PTS includes physical page numbers PPN and program times PT. For example, the program time stamp table PTS includes information about program times of a plurality of pages included in a nonvolatile memory device 120.

The memory controller 110 detects program elapsed times of the pages by means of a timer (not shown) and the program time stamp table PTS. The memory controller 110 adjusts a read voltage set depending on the detected program elapsed times and performs a read operation by means of the adjusted read voltage set. For example, the nonvolatile memory device 120 has the physical characteristic that threshold voltages of memory cells decrease with the lapse of program time. As a program elapsed time of a selected page becomes longer, the memory controller 110 lowers read levels.

The memory controller 110 detects and corrects an error of raw data read using the adjusted read voltage set. If an error of the raw data is not corrected, the memory controller 110 may perform step S140 shown in FIG. 5.

For and the convenience of description, embodiments of an operation corresponding to step S130 shown in FIG. 5 are discretely described. However, the inventive concept is not limited thereto. For example, the memory controller 110 performs a read operation depending on the program time stamp table PTS; then, it performs a read operation using a PreDefined table PDT when an error is not corrected.

In the above-described embodiments, a read operation managed by a first read managing unit 112 is based on the PDT or the PTS, and a read operation managed by a second read managing unit 113 is a valley search operation. However, the inventive concept is not limited thereto. For example, a read operation managed by the first read managing unit 112 has reliability and error correction ratio higher than a read operation managed by the second read managing unit 113. Alternatively, a read operation managed by the first read managing unit 112 accompanies one read operation and an error correction operation, but a read operation managed by the second read managing unit 113 accompanies two or more read operations and an error correction operation.

Figure 15:
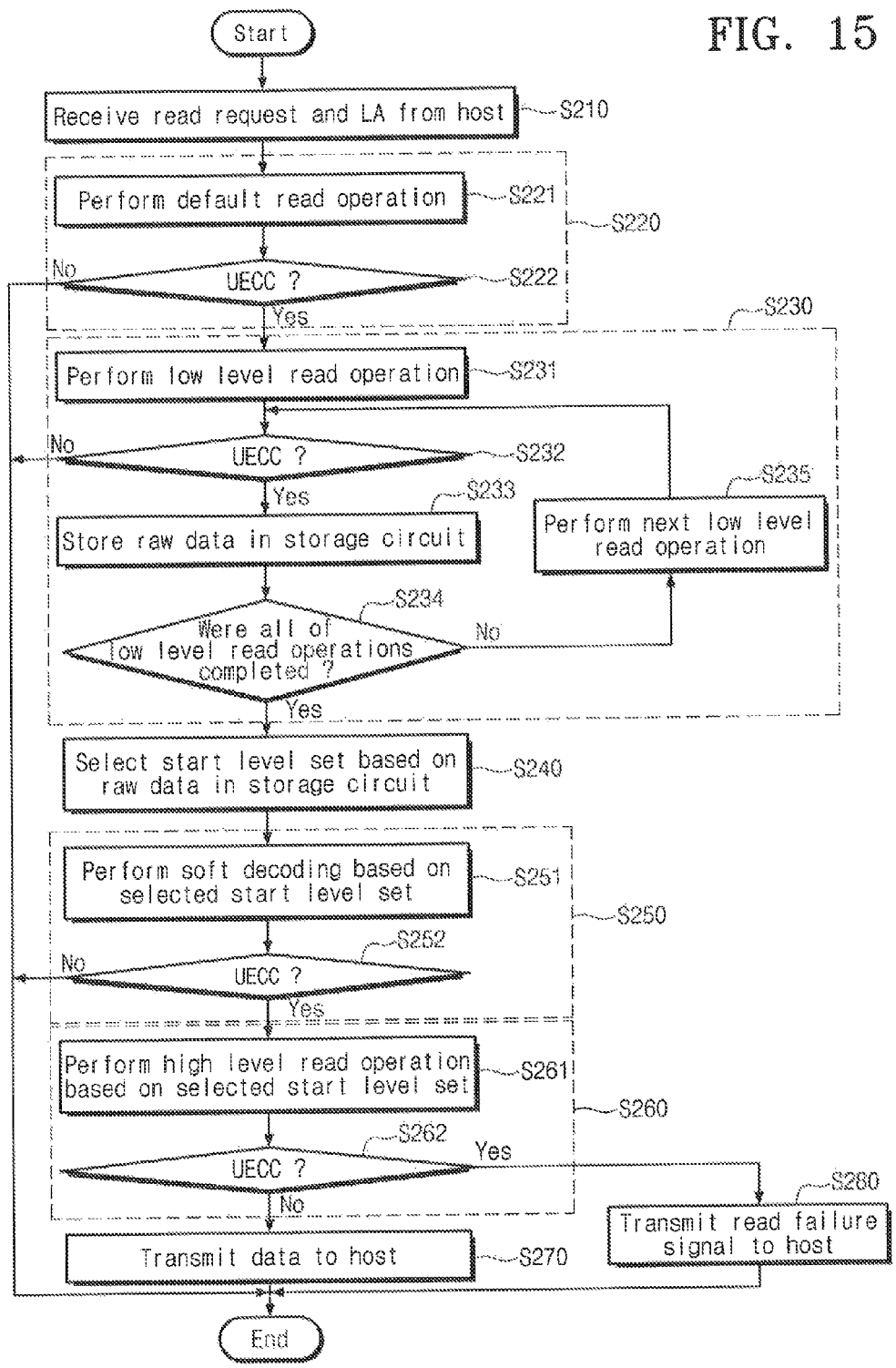
FIG. 15 is a flow chart showing an operation of a memory controller according to an exemplary embodiment of the present inventive concept.

FIG. 15 is a flow chart showing an operation of a memory controller according to an exemplary embodiment of the inventive concept. Referring to FIGS. 1 and 15, steps S210 through S240 are identical to steps S110 through S140 shown in FIG. 5, and a description thereof is thus omitted.

In step S250, a memory controller 110 performs a soft decoding operation using a selected starting voltage set. Step S250 contains steps S251 and S252. In exemplary embodiments, soft decoding is accomplished by performing a plurality of read operations on memory cells connected to a word line, making soft decision depending on results of the plurality of read operations, and outputting raw data depending on the soft decision result. For example, the memory controller may compare the results of the plurality of read operations and to determine values of each bit in raw data based on result of comparison.

In step S251, the memory controller 110 performs a read operation using the selected starting voltage set. The memory controller 110 may further perform two or more read operations using read voltages sets different from the selected starting voltage set. The memory controller 110 soft-decodes the read data to generate soft-decoded raw data.

In step S252, the memory controller 110 detects and corrects an error of the soft-decoded raw data. When an error of the soft-decoded raw data is corrected, the method proceeds to step S270; on the other hand, when an error of the soft-decoded raw data is not corrected, the method proceeds to step S260.

Steps S260 through S280 are identical to steps S150 through S170 shown in FIG. 5, and a description thereof is thus omitted.

According to an exemplary embodiment described with reference to FIG. 15, the memory controller 110 further performs a soft decoding operation using a selected starting voltage set before performing a read operation by means of a second read managing unit 113 to increase reliability of the soft decoding operation.

Figure 16:
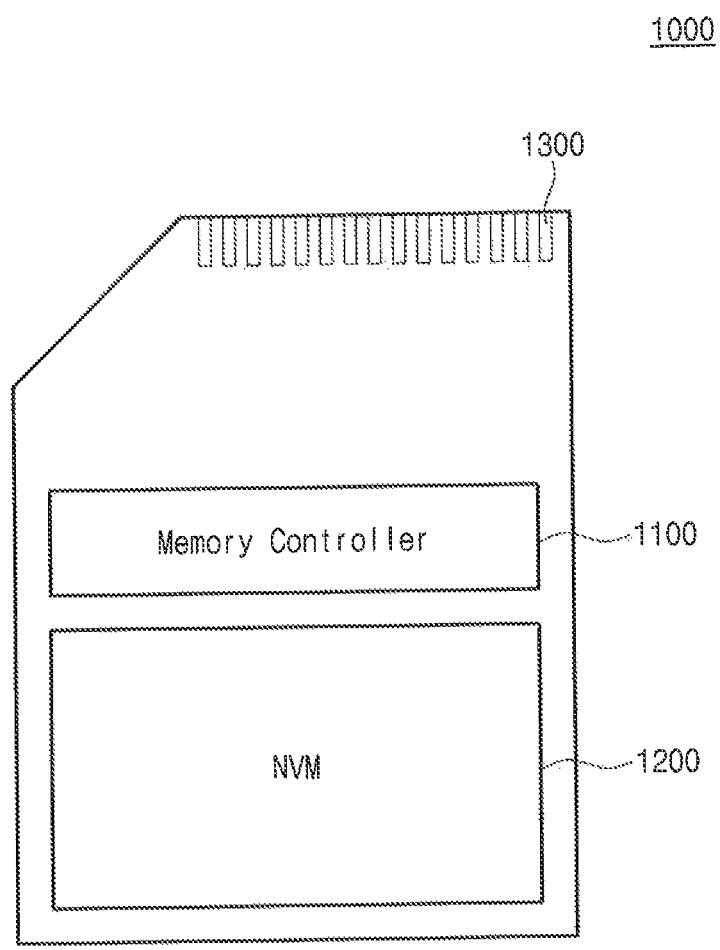
FIG. 16 is a block diagram showing a memory card system including a nonvolatile memory system according to an exemplary embodiment of the present inventive concept.

FIG. 16 is a block diagram showing a memory card system including a nonvolatile memory system according to an exemplary embodiment of the present inventive concept. Referring to FIG. 16, a memory card system 1000 contains a memory controller 1100, a nonvolatile memory 1200, and a connector 1300.

The memory controller 1100 is connected to the nonvolatile memory 1200. The memory controller 1100 accesses the nonvolatile memory 1200. For example, the memory controller 1100 may be adapted to control an overall operation of the nonvolatile memory 1200 including, but not limited to, a read operation, a write operation, an erase operation, and a background operation. The memory controller 1100 provides an interface between the nonvolatile memory 1200 and a host. The memory controller 1100 drives firmware for controlling the nonvolatile memory 1200.

The memory controller 1100 may include components such as, but not limited to, a RAM, a processing unit, a host interface, a memory interface, and an error correction unit.

The memory controller 1100 communicates with an external device according to a particular communication protocol. For example, the memory controller 1100 may communicate with the external device through at least one of various interface protocols such as, but not limited to, a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a Firewire protocol.

The memory controller 1100 may be a memory controller operated according to an exemplary embodiment of the present inventive concept. The nonvolatile memory 1200 may be implemented with a variety of nonvolatile memory devices, such as, but not limited to, an EPROM (Electrically Erasable and Programmable ROM), a NAND flash memory, a NOR flash memory, a PRAM (Phase-change RAM), an ReRAM (Resistive RAM), a FRAM (Ferroelectric RAM), and an STT-MRAM (Spin-Torque Magnetic RAM).

The memory controller 1100 and the nonvolatile memory 1200 may be integrated in a single semiconductor device.

The memory controller 1100 and the nonvolatile memory 1200 may be integrated in a single semiconductor device to form a solid state drive (SSD). The memory controller 1100 and the nonvolatile memory 1200 may be integrated in a single semiconductor device to form a memory card such as, but not limited to, a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), and a universal flash storage (UFS).

The nonvolatile memory 1200 or the memory card system 1000 may be packaged according to any of a variety of different packaging technologies. Examples of such packaging technologies may include the following: PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Figure 17:
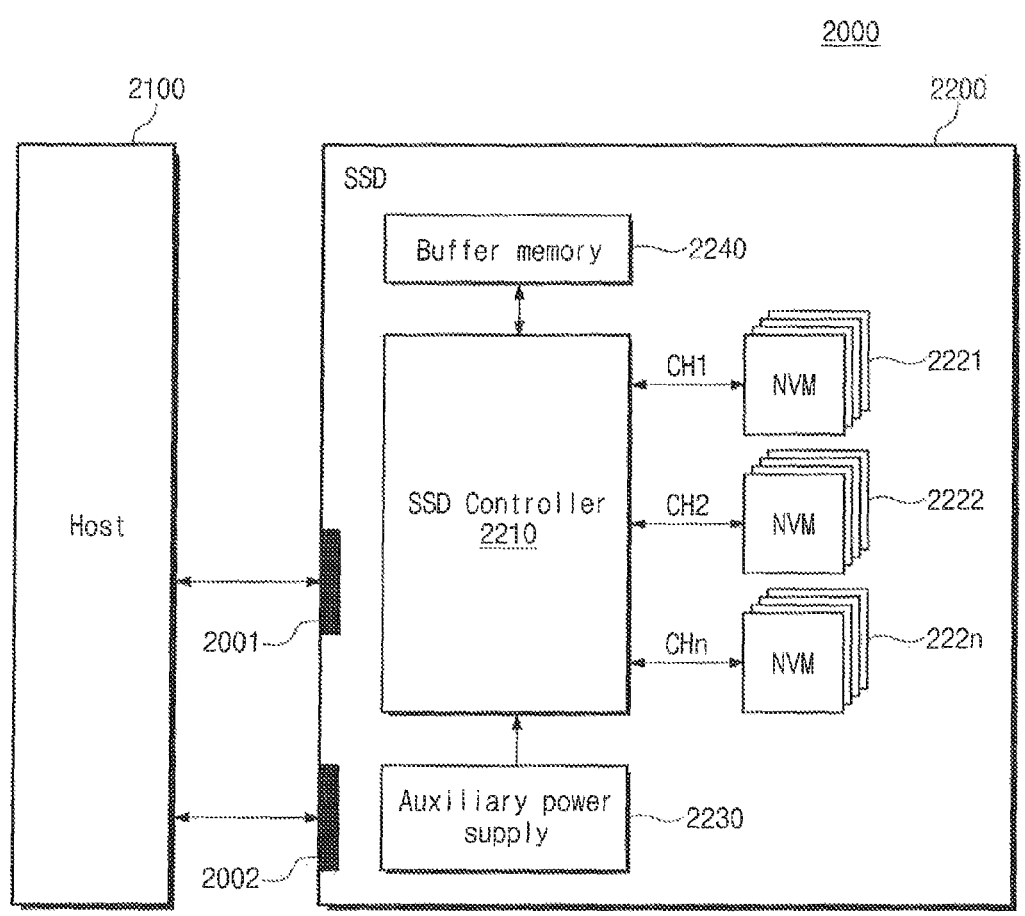
FIG. 17 is a block diagram showing a solid state drive including a nonvolatile memory system according to an exemplary embodiment of the present inventive concept.

FIG. 17 is a block diagram showing a solid state drive including a nonvolatile memory system according to an embodiment of the inventive concepts. Referring to FIG. 17, a solid state drive (SSD) system 2000 comprises a host 2100 and an SSD 2200. The SSD 2200 exchanges signals SGL with the host 2100 through the host interface 2001 and is supplied with a power through a power connector 2002. The SSD 2200 comprises a plurality of flash memories 2221 to 222n, an SSD controller 2210, an auxiliary power supply 2230, and a buffer memory 2240.

The SSD controller 2210 controls the flash memories 2221 to 222n in response to a signal SIG from the host 2100. For example, the SSD controller 2210 may be a memory controller described with reference to FIGS. 1 to 15.

The auxiliary power supply 2230 is connected to the host 2100 via the power connector 2002. The auxiliary power supply 2230 is charged by a power PWR from the host 2100. When a power is not smoothly supplied from the host 2100, the auxiliary power supply 2230 powers the SSD system 2000. The auxiliary power supply 2230 may be placed inside or outside the SSD 2200. For example, the auxiliary power supply 2230 may be put on a main board to supply an auxiliary power to the SSD 2200.

The buffer memory 2240 acts as a buffer memory of the SSD 2200. For example, the buffer memory 2240 temporarily stores data received from the host 2100 or from the flash memories 2221 to 222n, or it temporarily stores metadata (e.g., mapping tables) of the flash memories 2221 to 222n. The buffer memory 2240 may include volatile memories such as DRAM, SDRAM, DDR SDRAM, LPDDR SDRAM, SRAM, and so on or nonvolatile memories such as FRAM ReRAM, STT-MRAM, PRAM, and so on.

The SSD controller 2210 may be operated according to an exemplary embodiment of the present inventive concept.

Figure 18:
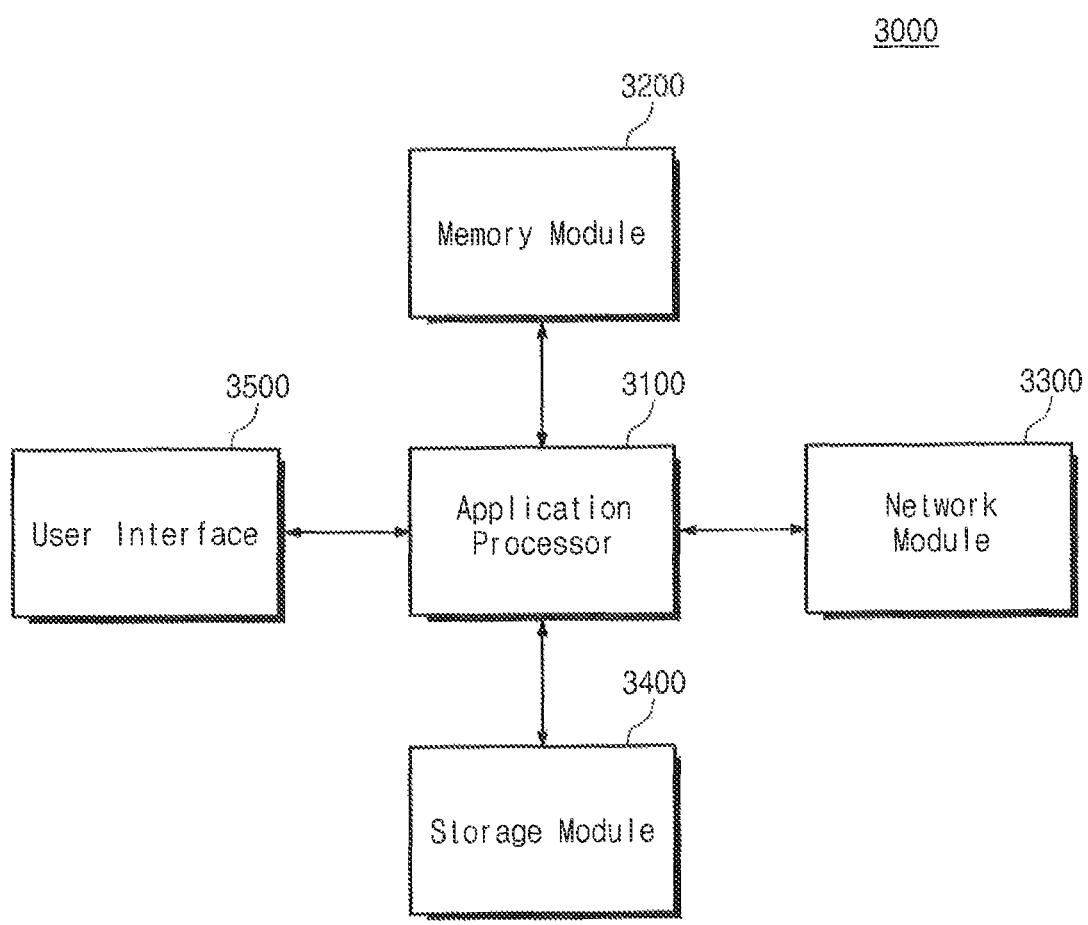
FIG. 18 is a block diagram showing a user system including a nonvolatile memory system according to an exemplary embodiment of the present inventive concept.

FIG. 18 is a block diagram showing a user system including a nonvolatile memory system according to an exemplary embodiment of the present inventive concept. Referring to FIG. 18, a user system 3000 includes an application processor 3100, a memory module 3200, a network module 3300, a storage module 3400, and a user interface 3500.

The application processor 3100 drives components of the user system 3000, an operating system, and so on. For example, the application processor 3100 may include controllers for controlling components of the user system 3000, graphics engines, a variety of interfaces, and so on. The application processor 3100 may be implemented with a system-on-chip (SoC).

The memory module 3200 operates as a main memory, a working memory, a buffer memory, or a cache memory of the user system 3000. The memory module 3200 may be implemented with a volatile random access memory, such as DRAM (Dynamic Random Access Memory), SDRAM (Synchronous DRAM), DDR SDRAM (Double Date Rate SDRAM), DDR2 SDRAM, DDR3 SDRAM, LPDDR DRAM, LPDDR2 DRAM, or LPDDR3 DRAM or a nonvolatile random access memory, such as PRAM (Phase-change RAM), MRAM (Magnetic RAM), RRAM (Resistive RAM), or FRAM (Ferroelectric RAM).

The network module 3300 communicates with external devices. For example, the network module 3300 may support wireless communications, such as CDMA (Code Division Multiple Access), GSM (Global System for Mobile communication), WCDMA (wideband CDMA), CDMA-2000, TDMA (Time Division Multiple Access), LTE (Long Term Evolution), Wimax, WLAN, UWB, Bluetooth, WI-DI, and so on. As another embodiment, the network module 3300 may be embedded in the application processor 3100.

The storage module 3400 stores data. For example, the storage module 3400 stores data received from an external device. Alternatively, the storage module 3400 provides the application processor 3100 with data stored therein. For example, the storage module 3400 may be implemented with a nonvolatile semiconductor memory device such as PRAM, MRAM, RRAM, NAND flash memory, NOR flash memory, or a three-dimensional NAND flash memory.

The storage module 3400 may include a memory controller 110 operated according to an exemplary embodiment.

The user interface 3500 may provide interfaces for providing data or commands to the application processor 3100 or for outputting data to an external device. For example, the user interface 3500 may include user input interfaces, such as a key board, a key pad, a button, a touch panel, a touch screen, a touch pad, a touch ball, a camera, a microphone, a Gyroscope, a vibration sensor, a piezoelectric element, and so on. The user interface 3500 may include user output interfaces, such as an LCD (Liquid Crystal Display) device, an OLED (Organic Light Emitting Diode) display device, an AMOLED (Active Matrix OLED) display device, an LED, a speaker, a motor, and so on.

In a read operation, a memory controller performs a read operation using a default read voltage set. At this time, when an UECC error is generated, the memory controller performs low-level read operations. When the UECC error is generated from data read through the low-level read operations, the memory controller selects a starting voltage set by means of data read through the low-level read operations and performs a high-level read operation using the selected starting voltage set. The number of read operations included in the low-level read operation is less than that included in the high-level read operation. For this reason, the reliability and error correction ratio of the low-level read operation may be low. As described above, a starting voltage set is selected by means of data read through a previous read operation, thereby improving reliability on a second read operation and reducing overhead. This means that a memory controller with improved reliability and performance can be provided.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of operating a nonvolatile memory device including a plurality of memory cells, comprising:
    performing a default read operation on a page of the plurality of memory cells using a default read voltage set to generate default raw data;
    performing an error detecting and correcting operation on the default raw data;
    if error bits of the default raw data are uncorrectable, performing a predetermined number of low-level read operations on the page using a plurality of read voltage sets to generate a plurality of low-level raw data, wherein the plurality of read voltage sets and the default read voltage set are different from each other;
    selecting one of the plurality of read voltage sets as a starting voltage set based on the plurality of low-level raw data; and
    performing a high-level read operation using the selected starting voltage set on the page to generate high-level raw data,
    wherein the performing of the high-level read operation includes:
        detecting valley values of two adjacent threshold voltage distributions using the selected starting voltage set;
        generating the high-level raw data by performing a read operation using the detected valley values as a read voltage,
    wherein the starting voltage set is a read voltage set corresponding to low-level raw data having the smallest difference in numbers of respective program states among the plurality of low-level raw data;
    determining whether error bits of the default raw data correctable;
    determining whether error bits of the plurality of low-level raw data are correctable;
    determining whether error bits of the high-level raw data are correctable;
    programming randomly data so that numbers of respective program states of memory cells in each page are substantially the same;
    if the error bits of the plurality of low-level raw data are determined as correctable,
    correcting the one among the plurality of low-level raw data to generate corrected low-level raw data and de-randomizing the corrected low-level raw data before the corrected low-level raw data is transmitted to an external device; and
    if the error bits of the high-level raw data are determined as correctable, correcting the high-level raw data to generate corrected high-level raw data and de-randomizing the corrected high-level raw data before the corrected high-level raw data is transmitted to the external device.

2. The method of claim 1, further comprising:
    if the error bits of the default raw data are corrected, transmitting the corrected default raw data to an external device.

3. The method of claim 1, further comprising:
    if the error bits of one of the plurality of low-level raw data are corrected, transmitting the corrected low-level raw data to an external device.

4. The method of claim 1,
    wherein the detecting the valley values of two adjacent threshold voltage distributions includes:
        performing one or more read operations using one or more read voltage sets different from the selected starting voltage set; and
        determining the valley values depending on results of the one or more read operations.

5. The method of claim 1,
    wherein the performing of the predetermined number of low-level read operations includes:
    storing the plurality of low-level raw data in a storage circuit, if each low-level raw data is uncorrectable.

6. The method of claim 1,
    wherein if the page stores information including MSB page data only, the starting voltage set is a read voltage set corresponding to low-level raw data having the smallest difference between a number of data 1s and a number of data 0s, among the plurality of low-level raw data.

7. The method of claim 1, further comprising:
    performing a soft-decoding operation on the plurality of memory cells to generate soft-decoded raw data.

8. The method of claim 1,
    wherein the starting voltage set is selected depending on the default raw data and the plurality of low-level raw data.

9. The method of claim 1, wherein an operating speed of the high-level read operation is slower than an operating speed of the predetermined number of low-level read operations.

10. A method of reading data from a nonvolatile memory device including a plurality of memory cells, comprising:
    performing a default read operation on the plurality of memory cells using a default read voltage set to generate default raw data;
    performing an error detecting and correcting operation on the default raw data; determining whether error bits of the default raw data are correctable;
    if the error bits of the default raw data are determined as uncorrectable,
    performing first through n-th (n is integer greater than 1) low-level read operations using first through n-th read voltage sets, respectively, to generate first through n-th low-level raw data,
    wherein each of the first through n-th low-level read operations includes error correction;
    if error bits of the first through n-th low-level raw data are determined as uncorrectable,
    selecting one from the default read voltage set and the first through n-th read voltage sets as a starting voltage set on the basis of the first through n-th low-level raw data and the default raw data;
    performing a high-level read operation using the starting voltage set to generate high-level raw data, wherein the high-level read operation is performed two or more times depending on the selected starting voltage set; and
    determining whether error bits of the high-level raw data are correctable,
    wherein the starting voltage set is a read voltage set corresponding to raw data having the smallest difference between a number of data 1s and a number of data 0s, among the first through n-th low-level raw data and the default raw data;

programming randomly data so that numbers of respective program states of memory cells in each page are substantially the same: and if the error bits of the high-level raw data are determined as correctable, correcting the high-level raw data to generate corrected high-level raw data and de-randomizing the corrected high-level raw data before the corrected high-level raw data is transmitted to an external device.

11. The method of claim 10, wherein an operating speed of the high-level read operation is slower than an operating speed of the low-level read operation.

12. A method of operating a nonvolatile memory device including a plurality of pages, comprising:

programming first data to a first page of the plurality of pages;

performing a default read operation on the first page using a default read voltage set to generate default raw data;

performing an error detecting and correcting operation on the default raw data;

determining whether error bits of the default raw data are correctable;

if the error bits of the default raw data are determined as correctable, transmitting the default data to an external device;

if the error bits of the default raw data are determined as uncorrectable, repeating performing a low-level read operation on the first page and determining whether error bits of the low-level read operation are correctable;

if the error bits of the low-level read operation are determined as correctible, correcting the error bits of the low-level read operation to generate corrected data of the low-level read operation and transmitting the corrected data of the low-level read operation to an external device; and if error bits of the low-level read operation performed last are determined as uncorrectable after the repeating of the performing the low-level read operation and the determining of whether error bits of the low-level read operation are correctible is performed at a predetermined number, performing a high-level read operation after the low-level read operation, wherein each low-level read operation is performed using one of a plurality of first read voltage sets and wherein each first read voltage set is different from each other, and wherein the high-level read operation is performed using a starting read voltage set and the starting read voltage set is a read voltage set corresponding to low-level raw data having the smallest difference in numbers of respective program states among a plurality of low-level raw data generated from the low-level read operation and the default raw data, and wherein the method further comprises:

programming randomly data including the first data so that numbers of respective program states of memory cells in each page are substantially the same; and if the error bits of the low-level read operation are determined as correctible, correcting the error bits to generate corrected low-level raw data and de-randomizing the corrected low-level raw data before the corrected low-level raw data is transmitted to the external device.

13. The method of claim 12, wherein after each low-level operation is performed to generate low-level raw data and if error bits of the low-level raw data are determined as uncorrectable, the low-level raw data is stored in a storage circuit.

14. The method of claim 13, wherein the starting read voltage set is a read voltage set for low-level raw data having the smallest difference in numbers of respective program states among each low-level raw data.

15. The method of claim 12, wherein an operating speed of the high-level read operation is slower than an operating speed of the low-level read operation.

* * * * *